(12) United States Patent
Zimmer et al.

(10) Patent No.: US 10,989,769 B2
(45) Date of Patent: Apr. 27, 2021

(54) MAGNETO-RESISTIVE STRUCTURED DEVICE HAVING SPONTANEOUSLY GENERATED IN-PLANE CLOSED FLUX MAGNETIZATION PATTERN

(71) Applicant: Infineon Technologies AG, Neubiberg (DE)

(72) Inventors: Juergen Zimmer, Neubiberg (DE); Armin Satz, Villach (AT); Wolfgang Raberg, Sauerlach (DE); Hubert Brueckl, Wiener Neudorf (AT); Dieter Suess, Herzogenburg (AT)

(73) Assignee: Infineon Technologies AG, Neubiberg (DE)

( * ) Notice: Subject to any disclaimer, the term of this patent is extended or adjusted under 35 U.S.C. 154(b) by 819 days.

(21) Appl. No.: 14/141,660

(22) Filed: Dec. 27, 2013

(65) Prior Publication Data

US 2015/0185297 A1    Jul. 2, 2015

(51) Int. Cl.
G01R 33/09    (2006.01)

(52) U.S. Cl.
CPC ......... *G01R 33/093* (2013.01); *G01R 33/095* (2013.01); *G01R 33/096* (2013.01); *G01R 33/098* (2013.01)

(58) Field of Classification Search
CPC .... G01R 33/09; G01R 33/091; G01R 33/093; G01R 33/095; G01R 33/096; G01R 33/06; G01R 33/098; H01L 27/22; H01L 43/08; H01L 29/82; G11C 11/16; G11C 11/161; H03B 15/006; G11B 5/39; G11B 5/3903; G11B 5/3906; G11B 5/3909; G11B 5/3912; G11B 5/1278; B82Y 25/00; B82Y 10/00

See application file for complete search history.

(56) References Cited

U.S. PATENT DOCUMENTS

| | | |
|---|---|---|
| 5,883,763 A | 3/1999 | Yuan |
| 6,735,062 B1 | 5/2004 | Pokhil et al. |
| 7,057,862 B2 | 6/2006 | Kasiraj |
| 7,072,208 B2 | 7/2006 | Min |
| 7,356,909 B1 | 4/2008 | Min |
| 7,697,243 B1* | 4/2010 | Novosad ............... B82Y 10/00 324/207.21 |
| 8,018,690 B2 | 9/2011 | Min |

(Continued)

FOREIGN PATENT DOCUMENTS

| | | |
|---|---|---|
| CN | 103091650 A | 5/2013 |
| CN | 104157068 A | 11/2014 |

(Continued)

OTHER PUBLICATIONS

Aranda et et al., *Limits for the vortex state spin torque oscillator in magnetic nanopillars: Micromagnetic simulations for a thin free layer*, Journal of Applied Physics, J. Appl. Phys. 108, 123914 (2010), 13 pages.

(Continued)

*Primary Examiner* — David M Schindler
(74) *Attorney, Agent, or Firm* — Schiff Hardin LLP

(57) ABSTRACT

A device according to an embodiment may comprise a magneto-resistive structure comprising a magnetic free layer with a spontaneously generated in-plane closed flux magnetization pattern and a magnetic reference layer having a non-closed flux magnetization pattern.

28 Claims, 20 Drawing Sheets

(56) References Cited

U.S. PATENT DOCUMENTS

| | | | |
|---|---|---|---|
| 8,144,425 | B2 | 3/2012 | Clinton |
| 2004/0080850 | A1 | 4/2004 | Yamamoto et al. |
| 2005/0174701 | A1* | 8/2005 | Kasiraj ............. G11B 5/39 360/324.2 |
| 2007/0165334 | A1* | 7/2007 | Takenaga ............ B82Y 25/00 360/313 |
| 2007/0247901 | A1* | 10/2007 | Akinaga ............. B82Y 25/00 365/173 |
| 2008/0180865 | A1* | 7/2008 | Min .................. B82Y 10/00 360/324.11 |
| 2010/0078742 | A1* | 4/2010 | Zheng ............... H01L 29/82 257/421 |
| 2011/0085258 | A1* | 4/2011 | Bae ................. G11C 19/0808 360/31 |
| 2012/0326713 | A1* | 12/2012 | Zimmer ............ G01R 33/096 324/252 |
| 2013/0009258 | A1* | 1/2013 | Lee ................. H01F 10/3254 257/421 |
| 2013/0116943 | A1* | 5/2013 | Pant ................. G01R 33/098 702/57 |
| 2013/0288398 | A1* | 10/2013 | Yamamoto ........... H01L 43/10 438/3 |

FOREIGN PATENT DOCUMENTS

| | | |
|---|---|---|
| CN | 104218147 | 12/2014 |
| EP | 2712078 B1 | 6/2015 |

OTHER PUBLICATIONS

Aharoni, Amikam, *Upper bound to a single domain behavior of a ferromagnetic cylinder*, Journal of Applied Physics, J. Appl. Phys. 68, 2892 (1990), 10 pages.

Berkov et al., *Micromagnetic Simulations of the Magnetization Precession Induced by a Spin Polarized Current in a Point Contact Geometry*, Nov. 18, 2013, pp. 1-12, available at http://arxiv.org/abs/cond-mat/0601099.

Wachowiak et al., *Thickness dependent magnetization states of Fe islands on W(110): From single domain to vortex and diamond patterns*, Applied Physics Letters, Appl. Phys. Lett. vol. 84, No. 6, 948 (2004), 4 pages.

Breth et al., *Thermal Switching Field Distribution of a Single Domain Particle for Field—Dependent attempt Frequency*, Journal of Applied Physics, J. Appl. Phys. 112, 23903 (2012), 5 pages.

Buchanan et al., *Magnetization Reversal in Patterned Double-Vortex Structures*, Journal of Applied Physics, J. Appl. Phys. 97, 10H503 (2005), 3 pages.

Buchanan et al., *Magnetic-Field Tunability of the Vortex Translational Mode in Micron-Sized Permalloy Ellipses: Experiment and Micromagnetic Modeling*, Physical Review B, Phys. Rev. B 74, 064404 (2006), 5 pages.

Burgess et al., *A Deformable Model for Magnetic Vortex Pinning*, (2012), 27 pages.

Chung et al., *Phase Diagram of Magnetic Nanodisks Measured by Scanning Electron Microscopy with Polarization Analysis*, Physical Review B, Phys. Rev. B 81, 024410 (2010), 7 pages.

Cowburn, R.P., *Property Variation with Shape in Magnetic Nanoelements*, J. Phys. D: Appl. Phys. 33, R1 (2000), 17 pages.

Cowburn et al., *Single-Domain Circular Nanomagnets*, Physical Review Letters, Phys. Rev. Lett 83, 1042 (1999), 4 pages.

Whittenburg, Scott, *Micromagnetics Simulation of Deep-Submicron Supermalloy Disks*, University of New Orleans, L., Appl. Phys. 90, 5235, Nov. 15, 2001, 4 pages.

ZKP Struktur und Energie von Blochlinien in dünnen ferromagnetischen Schichten, Phys. Kondens. Mater. 4, 8 (1965).

Fernandez et al., *Nucleation and Annihilation of Magnetic Vortices in Submicron-Scale Co Dots*, J. Appl. Phys. 87, 1395 (2000), 8 pages.

Gomez et al., *Domain Wall Motion in Micron-Sized Permalloy Elements*, J. Appl. Phys. 85, 4598 (1999), 4 pages.

Gubbiotti, Gianluca, *Magnetic Properties of Submicron Circular Permalloy Dots*, IEEE Trans. Magn. 38, pp. 2532-2534 (2002).

Guslienko, et al., *Magnetization Reversal Due to Vortex Nucleation, Displacement, and Annihilation in Submicron Ferromagnetic Dot Arrays*, Phys. Rev. B, 65 24414 (2001), 10 pages.

Hertel, Riccardo, Thickness *Dependence of Magnetization Structures in Thin Permalloy Rectangles*, (2002), 7 pages.

Hoffmann et al., *Single Domain and Votex State in Ferromagnetic Circular Nanodots*, J. Appl. Phys. 92, 5463 (2002), 6 pages.

Huang et al., *Micromagnetic Simulation of Spin Transfer Torque Magnetization Precession Phase Diagram in a Spin-Valve Nanopillar under External Magnetic Fields*, Condensed Matter Physics, May 29, 2012, 12 pages.

Hubert et al., *Magnetic Domains—The Analysis of Magnetic Microstructures* (Berlin, New York, Heidelberg: Springer, 1998), pp. 450-459.

Ingvarsson et al., Thickness-*dependent magnetic properties of Ni8 1 Fe19.CO$_{9u}$FE$_{10}$ and Ni$_{d}$FE$_{12}$CO$_{2u}$ thin films*, Journal of Magnetism and Magnetic Materials 251 (2002) pp. 202-206.

Joseph, R I, *Ballistic Demagnetizing Factor in Uniformly Magnetized Cylinders*, J. Appl. Phys. 37, 4639 (1966), 6 pages.

Jubert et al., *Analytical Approach to the Single-Domain-to-Vortex Transition in Small Magnetic Disks*, Phys. Rev. B 70, 144402 (2004), 5 pages.

Kazantseva et al., *Towards Multiscale Modeling of Magnetic Materials: Simulations of FePt*, Phys. Rev. B 77, 184428 (2008), 7 pages.

Kirk et al., *Switching of Nanoscale Magnetic Elements*, App. Phys. Lett. 75, 3683 (1999), 4 pages.

Kronmueller et al., *Computational micromagnetism of magnetic structures and magnetisation processes in small particles*, J. Magn. Magn. Mater. (2000), 7 pages.

Lebecki et al., *Properties of magnetic vortices at elevated temperatures*, J. Appl. Phys. 113, 023906 (2013), 6 pages.

Lenssen et al., *Sensor Properties of a Robust Giant Magnetoresistance Material System at Elevated Temperatures*, J. Appl. Phys. 87, 6665 (2000), 3 pages.

Li et al., *Detection of Single Micron-Sized Magnetic Bead and Magnetic Nanoparticles Using Spin Valve Sensors for Biological Applications*, J. Appl. Phys. vol. 93, No. 10 (2003), 3 pages.

Metlov et al., *Map of Metastable States for Thin Circular Magnetic Nanocylinders*, Appl. Phys. Lett. 92, 112506 (2008), 4 pages.

Meyners et al., *Influence of Boundary Roughness on the Magnetization Reversal in Submicron Sized Magnetic Tunnel Junctions*, J. Appl. Phys. 93, 2676 (2003), 6 pages.

Novais et al., *Phase Diagram of Magnetic Configurations for Soft Magnetic Nanodots of Circular and Elliptical Shape Obtained by Micromagnetic Simulation*, (2009), 8 pages.

Novosad et al., *Nucleation and Annihilation of Magnetic Vortices in Sub-Micron Permalloy Dots*, IEEE Trans. Magn. 37, (2001), pp. 2088-2090.

Pokhil et al., *Spin vortex states and hysteretic properties of submicron size NiFe elements*, J. Appl. Phys. 87, 6319 (2000), 4 pages.

Prejbeanu et al., *In-plane reversal mechanisms in circular Co dots*, J. Appl. Phys. vol. 91, No. 10 (2002), 4 pages.

Rahm et al., *Multistable switching due to magnetic vortices pinned at artificial pinning sites*, Appl. Phys. Lett. vol. 85. No. 9 (2004), 3 pages.

Rave, Wolfgang, *Magnetic Ground State of a Thin-Film Element*, IEEE, vol. 36, No. 6 (2000), pp. 3886-3899.

Schaefer, Rudolf, *Hysteresis in Soft Ferromagnetic Films: Experimental Observations an Micromagnetic Analysis*, IEEE vol. 38. No. 5 pp. 2391-2393 (2002).

Schneider et al., *Stability of Magnetic Vortices in Flat Submicron Permalloy Cylinders*, J. Appl. Phys. vol. 92, No. 3 (2002), 8 pages.

Schneider et al., *Lorentz Microscopy of Circular Ferromagnetic Permalloy Nanodisks*, Appl. Phys. Lett. vol. 77, No. 18 (2000), 4 pages.

Shinjo et al., *Magnetic Vortex Core Observation in Circular Dots of Permalloy*, Science AAAS, vol. 289, (2000), 4 pages.

(56) References Cited

OTHER PUBLICATIONS

Scholz et al., *Transition from Single-Domain to Vortex State in Soft Magnetic Cylindrical Nanodots*, J.Magn. Magn. Mater. 266, 155 (2003), 9 pages.
Steiner, *Control of Magnetization States in Microstructured Permalloy Rings*, Appl. Phys. Lett. vol. 84, No. 6 (2004), 3 pages.
Yamaguchi et al., *Current Manipulation of a Vortex Confined in a Micron-Sized $Fe_{19}Ni_{x7}$ Disk*, Appl. Phys. Lett. vol. 95, 122506 (2009), 4 pages.
Yoo et al., *Switching Field Phase Diagram of Co Nanoring Magnets*, Appl. Phys. Lett. vol. 82, No. 15 (2003), 4 pages.

* cited by examiner

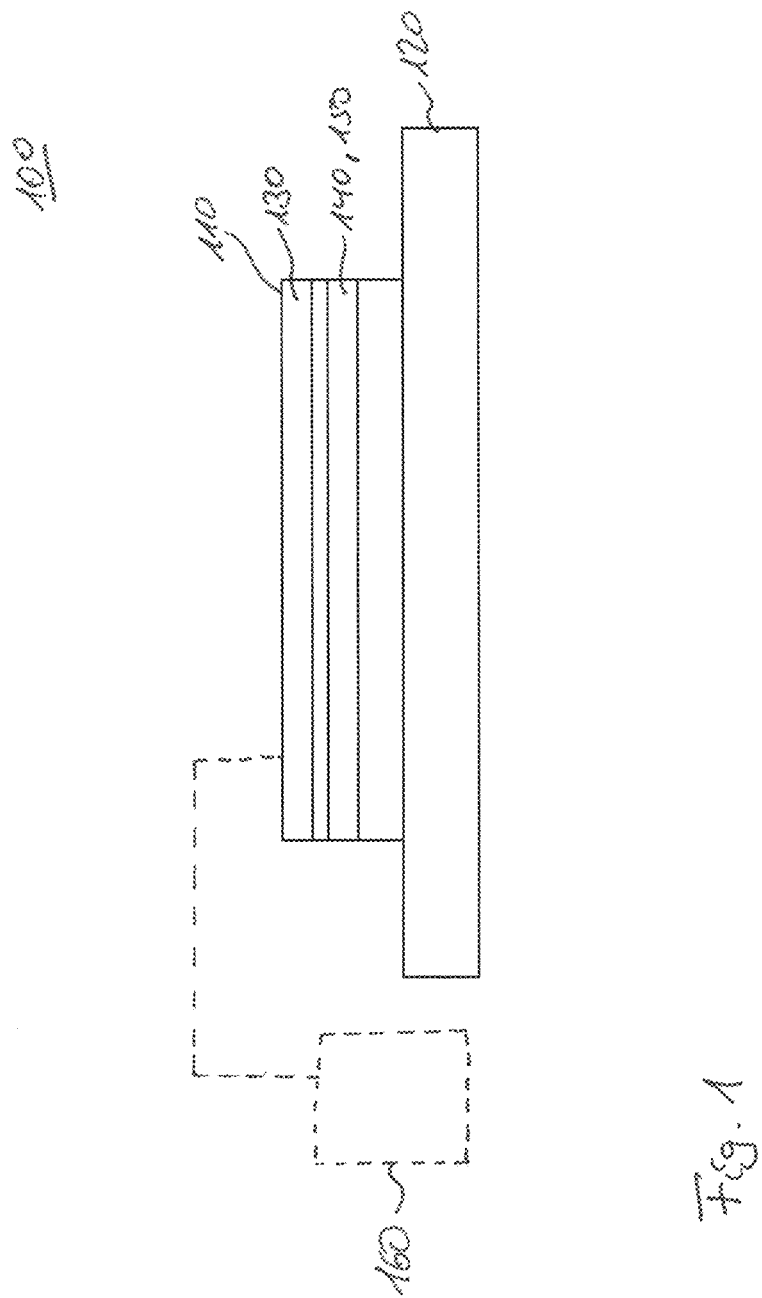

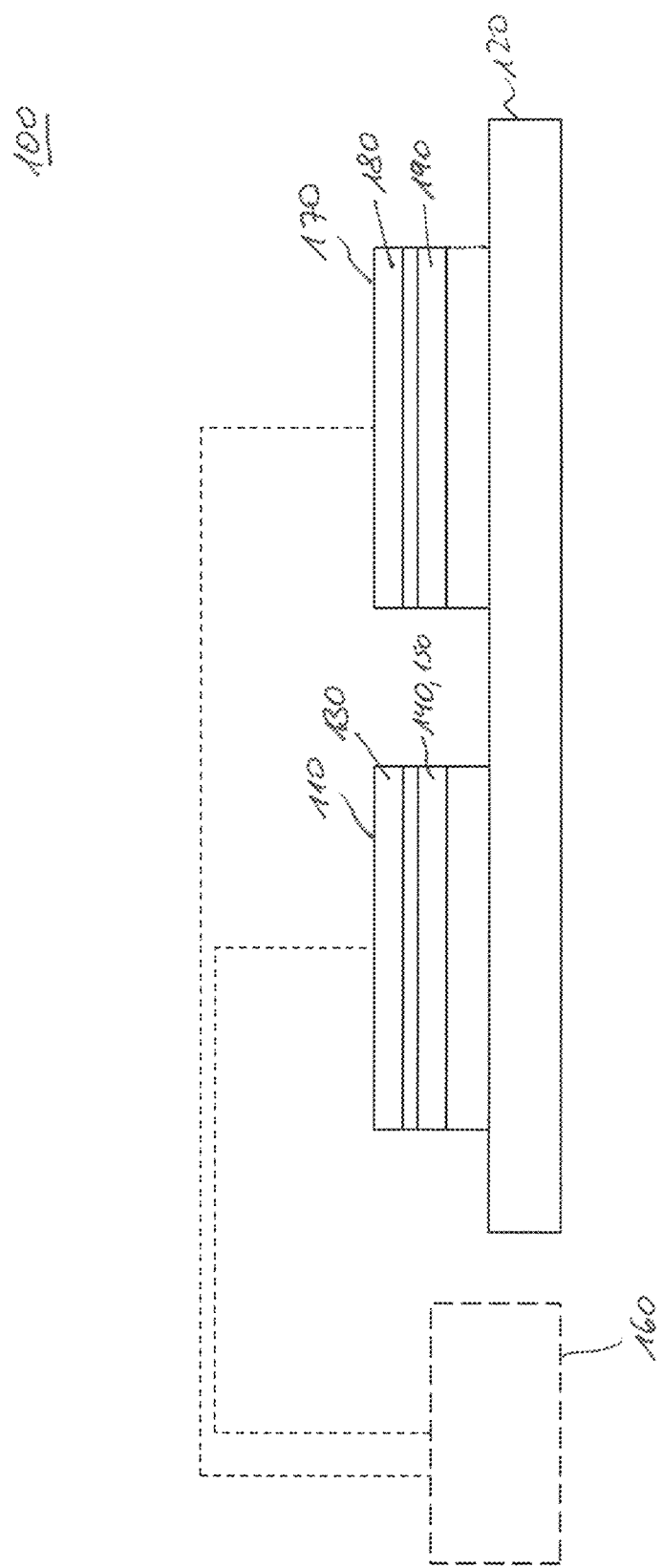

MAGNETO-RESISTIVE STRUCTURED DEVICE HAVING SPONTANEOUSLY GENERATED IN-PLANE CLOSED FLUX MAGNETIZATION PATTERN

TECHNICAL FIELD

Embodiments relate to a device, a magnetic sensor device and a method.

BACKGROUND

In many technical applications, magnetic fields are used for different purposes. A magnetic field comprises a magnetic field strength and a direction. Depending on the application in mind, any or all of the previously-mentioned physical quantities may be used technically to monitor or detect an operational condition of a system or the like. For instance, based on a magnetic field strength of a modulated magnetic field it is possible to determine a speed or velocity of a component such as a wheel of a car. By determining an angle of a magnetic field with respect to a reference direction, it may be possible to determine an orientation of a component such as a steering wheel with respect to the reference direction or a direction depending in a predetermined way on the reference direction. Other examples of applications come from fields such as security- or safety-related applications. For instance, by monitoring a magnetic field strength, it may be possible to verify if a safety mechanism is correctly enabled.

To detect and monitor any of the magnetic field strength or a combination thereof, different sensor technologies may be used. Magneto-resistive structures represent a sensor technology which may be very flexibly used and implemented.

SUMMARY

An ongoing effort is to improve a trade-off between fabricating, accuracy of determining the respective magnetic quantity or magnetic quantities and an implementation of a corresponding device.

A device according to an embodiment comprises a magneto-resistive structure comprising a magnetic free layer with a spontaneously-generated in-plane closed flux magnetization pattern and a magnetic reference layer having a non-closed flux magnetization pattern.

A magnetic sensor device according to an embodiment comprises a magneto-resistive structure comprising a magnetic free layer configured to provide an in-plane closed flux magnetization pattern and a magnetic reference layer comprising a reference magnetization pattern, a further magneto-resistive structure comprising a further magnetic free layer with an in-plane non-closed flux magnetization pattern and a further magnetic reference layer comprising a further reference magnetization pattern, and at least one circuit to detect a change of an electrical parameter of the magneto-resistive structure and to detect a change of an electrical parameter of the further magneto-resistive structure in response to an applied external magnetic field.

A device according to an embodiment comprises a magneto-resistive structure comprising a magnetic free layer with an in-plane closed flux magnetization pattern and a magnetic reference layer having a non-closed flux magnetization pattern, wherein an electrical contact structure is configured to feed an electrical current into the magneto-resistive structure in a current-in-plane configuration.

A device according to an embodiment comprises a magneto-resistive structure comprising a magnetic free layer with an in-plane closed flux magnetization pattern comprising at least two ferromagnetic layers separated by an electrically insulating layer or a magnetic coupling layer.

A method according to an embodiment comprises detecting a change of a spontaneously formed in-plane closed flux magnetization pattern in a free layer in reference to a magnetic reference layer having a non-closed flux magnetization pattern.

BRIEF DESCRIPTION OF THE DRAWINGS

Several embodiments of the present invention will be described in the enclosed figures.

FIG. 1 shows a simplified cross-sectional view of a device according to an embodiment;

FIG. 2 shows a schematic cross-sectional view of a device according to a further embodiment;

DETAILED DESCRIPTION

Figure 3A:
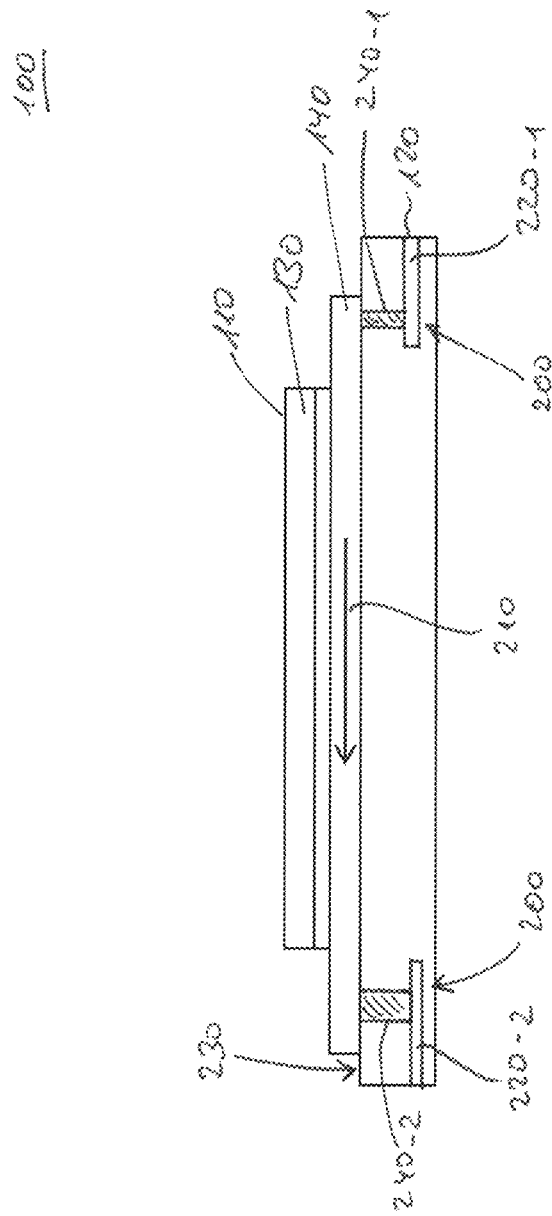
FIG. 3a shows a schematic cross-sectional view through a device according to an embodiment with a current-in-plane configuration.

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

Embodiments relate to magneto-resistive sensors and devices which are based on XMR technology which may, for instance, be used in the context of rotational speed sensor applications. However, applications are by far not restricted to rotational speed sensor applications. As outlined before, devices may be used in the context of very different technical applications, in which a magnetic quantity of a magnetic field is to be determined, monitored or sensed. In the following, applications will be described mostly in the context of rotational speed sensor applications for the sake of simplicity only. The devices described herein, may, nevertheless, be used in many other applications, in which a sensor or a device based on magneto-resistive technology may be used.

A magneto-resistive sensor (XMR) may, for instance, be implemented based on an anisotropic magneto-resistive (AMR) effect, the giant magneto-resistive (GMR) effect, the extraordinary magneto-resistive (EMR) effect and/or the tunnel magneto-resistive (TMR) effect. As will be laid out in more detail below, a magneto-resistive structure comprised in such a sensor or device may itself comprise a layered structure being deposited, for instance, on a surface of a die, a substrate or a similar carrier. In response to an externally-applied magnetic field, an electric parameter such as the electric resistance will change. This may, for instance, be detected, sensed or measured, by providing a current to the magneto-resistive structure parallel to the layered structure, which is referred to as a current-in-plane configuration (CIP configuration) or perpendicular to the layered structure, which is referred to as a current-perpendicular-to-plane configuration (CPP configuration). Unless stated otherwise, any of the devices and structures described below, may be operated in either the CPP configuration or the CIP configuration.

Moreover, with respect to the following figures, different devices will be described based on simplified block diagrams. With respect to these figures, the focus will be laid on different aspects and implementation details according to embodiments. Nevertheless, a device according to an embodiment, may implement one or more different aspects.

FIG. 1 shows a schematic cross-sectional view of a device 100 according to an embodiment comprising a magneto-resistive structure 110, which may be deposited on a substrate 120 such as a semiconductor die, to name just one example. The magneto-resistive structure 110 comprises a magnetic free layer 130 and a magnetic reference layer 140. The magnetic free layer may be designed in such a way that it spontaneously generates an in-plane closed flux magnetization pattern while the magnetic reference layer 140 is formed such that it provides a non-closed flux magnetization pattern.

The closed flux magnetization pattern of the magnetic free layer 130 may, for instance, comprise essentially a single in-plane closed flux magnetization pattern, wherein the non-closed flux magnetization pattern or the magnetic reference layer 140 may comprise a uniaxial magnetization pattern to name just one example. The closed flux magnetization pattern may, for instance, comprise at least partially a Landau pattern, a circumferential pattern, a vortex pattern or a combination of any of the previously-mentioned patterns. A Landau pattern comprises at least partially a polygon-like closed shape, while a circumferential pattern may comprise a smoother, rounder closed shape. A pure vortex pattern may be essentially circular. However, an in-plane closed flux magnetization pattern may comprise any combination of the previously-mentioned patterns. Moreover, a closed magnetization line of a magnetization pattern may be fully shaped according to any of the previously-mentioned patterns, but may also comprise sections following a different closed flux magnetization pattern.

The magnetic free layer 130 is implemented to spontaneously generate the in-plane closed flux magnetization pattern. In other words, the in-plane closed flux magnetization pattern may be formed when, for instance, an external magnetic field having an external magnetic field strength is smaller than a nucleation magnetic field strength. In other words, the in-plane closed flux magnetization pattern may, for instance, be formed by the magnetic free layer 130 assuming its ground state in a field-free condition in terms of an external magnetic field. The nucleation magnetic field strength may, as will be laid out below, depend on the material or materials used for the magnetic free layer 130, its geometry and other parameters. The nucleation magnetic field strength may, for instance, be equal to or larger than 100 μT. In other embodiments, the nucleation magnetic field strength may be equal to or larger than 1 mT, equal to or larger than 2 mT or equal to or larger than 5 mT.

As will be laid out in more detail below, by applying an external magnetic field, the spontaneously generated in-plane closed flux magnetization pattern may be shifted resulting in a net magnetization. However, when the external magnetic field comprises a magnetic field strength larger than an annihilation magnetic field strength, the in-plane closed flux magnetization pattern may be destroyed. The magnetic free layer 130 may be designed in such a way that the annihilation magnetic field strength may be at least equal to or larger than 5 mT, equal to or larger than 10 mT or equal to or larger than 20 mT. The annihilation magnetic field strength may be equal to or smaller than 100 mT, equal to or smaller than 75 mT or equal to or smaller than 50 mT.

For instance, the magnetic free layer 130 may comprise a non-elongated shape in the plane of the magnetic free layer. For instance, the magnetic free layer may comprise a convex shape comprising a first extension along a first direction and a second extension along a second direction, wherein the first direction and the second direction are both in the plane of the magnetic free layer 130. The second direction may be perpendicular to the first direction. The first extension may be equal to or smaller than the second extension in such a way that a ratio of the second extension to the first extension is at the most 2. In other examples, the ratio may be at the most 5 or at the most 10.

For instance, the magnetic free layer 130 comprises at least partially a circular shape, an elliptic shape, a triangular shape, a quadratic shape, a polygonal shape or any combination thereof. For instance, the magnetic free layer 130 may comprise a maximum structure size in the plane of the magnetic free layer 130 in a range between 100 nm and 5 μm. The previously-mentioned lower boundary of 100 nm and the upper boundary of 5 μm are by far not mandatory and may assume different values in different applications and devices. For instance, these parameters may depend on the material composition, surface roughness and other details. For instance, the lower boundary of 100 nm may also be 200 nm, 500 nm, or 1 μm in embodiments. Moreover, the upper boundary of 5 μm may be 3 μm, 2 μm or 1 μm in other embodiments.

The same also applies to a thickness of the magnetic free layer 130, which may, for instance, comprise a thickness in a range between 1 nm and 50 nm. In other devices 100, the thickness may be larger, for instance being larger than 2 nm, 5 nm or 10 nm. However, also smaller thicknesses than 1 nm may be implemented, while the upper boundary of 50 nm may—independent of the lower boundary of 1 nm—be smaller, for instance 40 nm, 30 nm, but may also be higher.

Moreover, as will be laid out in more detail below, a device 100 according to an embodiment may comprise a plurality of magneto-resistive structures 110 electrically coupled in series. The plurality of magneto-resistive structures may, for instance, be geometrically arranged in a regular pattern such as a square pattern, a hexagonal pattern, a triangular pattern or another regular pattern. The magnetic reference layer 140 may comprise a synthetic anti-ferromagnetic (SAF) structure 150 to pin the non-closed flux magnetization pattern of the magnetic reference layer 140. For instance, a synthetic anti-ferromagnetic structure 150 may comprise at least two cobalt-iron layers (CoFe) separated by a coupling non-ferromagnetic layer, for instance, comprising ruthenium (Ru). The synthetic anti-ferromagnet 150 may be coupled to a natural anti-ferromagnetic layer, for instance, comprising platinum manganese (PtMn), iridium manganese (IrMn) or nickel manganese (NiMn). Sometimes it may also be advisable to also include a seed layer or similar layers in the or below the magneto-resistive structure 110.

The device 100 may further comprise an optional circuit 160 to detect a change of the respective electrical parameter of the magneto-resistive structure 110 in response to the applied external magnetic field. For instance, in a magneto-resistive structure 110 the electrical resistance may change in response to a change of the external magnetic field. For instance, when supplying a constant current to the magneto-resistive structure 110 a voltage drop across the magneto-resistive structure 110 may change. Similarly, when a constant voltage is applied, the current may change. Naturally, the circuit 160 may use any other technique to detect the change of the electrical parameter of the magneto-resistive structure 110 including, for instance, feedback techniques to maintain a certain voltage or a certain current.

In another example, the circuit 160 may be implemented monolithically in the substrate 120. The circuit 160 may be based on a CMOS, Bipolar technology or a combination thereof (BiCMOS).

FIG. 2 shows a schematic block diagram of a magnetic sensor device 100 comprising a magneto-resistive structure 110 and a further magneto-resistive structure 170, which may be both deposited on a substrate 120. The magneto-resistive structure 110 comprises a magnetic free layer 130, which is capable of providing an in-plane closed flux magnetization pattern. The magneto-resistive structure 110 further comprises a magnetic reference layer 140, which may be implemented as described before. For instance, the magnetic free layer 140 may be configured to provide an in-plane closed flux magnetization pattern as described in context with FIG. 1.

Similar to the magneto-resistive structure 110 in FIG. 1, the magneto-resistive structure 110 of FIG. 2 further comprises a magnetic reference layer 140, which may, for instance, be implemented as described in the context of FIG. 1. In other words, the magnetic reference layer 140 may also comprise a non-closed flux magnetization pattern. Moreover, for the reference magnetization pattern being less sensitive to an externally applied magnetic field, the reference magnetization may be pinned using a synthetic anti-ferromagnet 150, which also may be comprised in the magnetic reference layer 140.

Similar to the magneto-resistive structure 110, the further magneto-resistive structure 170 comprises a further magnetic free layer 180 with an in-plane non-closed flux magnetization pattern. As a consequence, the further magnetic free layer 180 may comprise even in a ground state without an external magnetic field a net magnetization. The further magnetic free layer 180 may also comprise an explicit multi-domain structure.

The further magneto-resistive structure 170 further comprises a further magnetic reference layer 190, which may, for instance, have a further reference magnetization pattern, which may, for instance, be similar to that of a magnetic reference layer 140. Accordingly, also the further magnetic reference layer 190 may comprise a synthetic anti-ferromagnet or a similar structure to pin the further reference magnetization pattern.

The device 100 also comprises at least one circuit 160 which may be coupled to both the magneto-resistive structure 110 and the further magneto-resistive structure 170. The circuit 160 may be capable of detecting a change of an electric parameter of the magneto-resistive structure 110 and capable of detecting a change of an electrical parameter of the further magneto-resistive structure 170 in response to an applied external magnetic field. The circuit 160 is further configured to provide a sensing signal indicative of at least one direction of the external magnetic field and a strength of the external magnetic field acting on the free magnetic layer 130 and the further free magnetic layer 180 may start the electric response of the magneto-resistive structure 110 and the electric response of the further magneto-resistive structure 170.

The circuit 160 may, for instance, be implemented on the same substrate 120 or, in other words, on the same die or semiconducting die. However, the magneto-resistive structure 110, the further magneto-resistive structure 170 and the circuit 160 may be implemented on more than just one substrate 120. For instance, the two magneto-resistive structures 110, 170 may be implemented on the same substrate 120, while the circuit 160 may be implemented on a further substrate. Naturally, any combination of the circuit 160 and one of the magneto-resistive structures 110, 170 may be implemented on the same substrate 120, while the other magneto-resistive structure may be implemented on a different one. Naturally, also all three mentioned objects, the magneto-resistive structure 110, the further magneto-resistive structure 170 and the circuit 160 may be implemented on three different substrates 120. Depending on boundary conditions such as cost efficiency, availability of pre-manufactured entities, application-specific conditions and other conditions, any one of the previously-described implementations may offer a more attractive trade-off between the different parameters compared to another solution.

FIG. 3a shows a schematic cross-sectional view of a device 100 comprising a magneto-resistive structure 110, which may be deposited on a substrate 120. The magneto-resistive structure 110 comprises a magnetic free layer 130 with an in-plane closed flux magnetization pattern and a magnetic reference layer 140 having a non-closed flux magnetization pattern. The two magnetic layers 130, 140 are separated from one another by a layer, which may be an electrically conducting or an insulating layer. Moreover, the layer in between the two magnetic layers 130, 140 may eventually comprise a magnetic pattern of its own, which may, for instance, be induced by any of the neighboring magnetic layers 130, 140. This layer may also be implemented optionally in any of the other devices 100 previously described and, for instance, schematically depicted in FIGS. 1 and 2.

The device 100 further comprises an electrical contact structure 200 which is configured to feed an electrical current depicted by an arrow 210 into the magneto-resistive structure 110 in a current-in-plane (CIP) configuration. In other words, the current indicated by the arrow 210 flows primarily through the magneto-resistive structure 110 in a direction parallel to the layers of the magneto-resistive structures 110. In other words, the current depicted by the arrow 210 flows essentially completely through the magneto-resistive structure 110 in a direction in which the magneto-resistive structure 110 does not comprise its smallest extension.

To be even a little more specific, the devices 100 as shown in FIG. 3a as well as the other figures, the magneto-resistive structures 110 and optionally the further magneto-resistive structures 170 are fabricated by depositing layers of appropriate materials onto a main surface of the substrate 120 or a surface parallel to the main surface of the substrate 120. The substrate 120 may, for instance, have a thickness which is smaller than an extension of the substrate 120 along two other directions being essentially perpendicular to the direction corresponding to the thickness and essentially perpendicular to one another. For instance, when the thickness of the substrate 120 extends along a third direction (z-direction), an extension of the substrate 120 along a first direction (x-direction) and a second direction (y-direction) may be larger than the extension or thickness along the third or z-direction. For instance, the thickness may be at least two times, at least five times, or at least ten times smaller than the smallest extension along the first and second directions.

The same considerations may be valid for the layers comprised in the magneto-resistive structure 110 and, optionally, for the further magneto-resistive structure 170. Also these layers may comprise extensions along the first, second and third directions, where the third direction corresponds to the direction having the smallest extension. In other words, also the thickness of the layers of the magneto-resistive structure 110 and optionally of the further magneto-resistive structure 170 may be smaller than extensions in or parallel to the plane of the main surface of the substrate 120.

The electrical contacts structure 200 in the example shown in FIG. 3a comprises buried conductive layers 220-1, 220-2, which are arranged inside the substrate 120 and oriented essentially parallel to a main surface 230 of the substrate 120. The buried conductive layers 220 are coupled to the magneto-resistive structure 110 by vias 240-1, 240-2. However, in other examples of a device 100 the electrical contact structures 200 may comprise different layouts and/or different electrical connecting techniques.

Figure 3B:
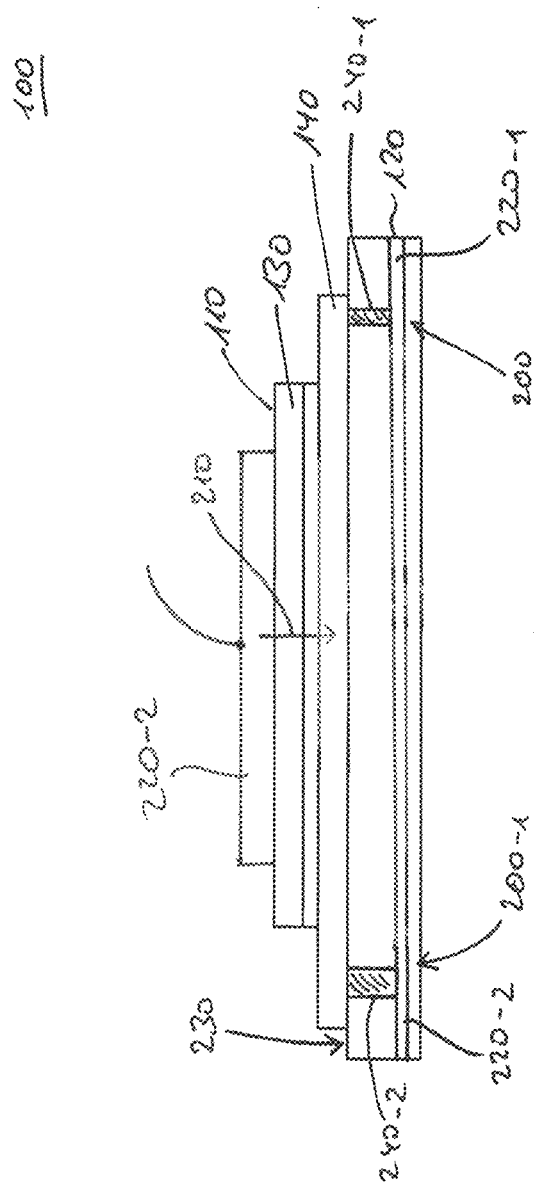
FIG. 3b shows a schematic cross-sectional view through a device according to an embodiment with a current-perpendicular-to-plane configuration.

FIG. 3b shows a schematic cross-sectional view through a device 100 according to an embodiment with a current-perpendicular-to-plane (CPP) configuration. For instance, the device 100 shown in FIG. 3b may be implemented, for instance, as a TMR device comprising a TMR structure as the magneto-resistive structure 110. Compared to the device 100 of FIG. 3a, the electrical contact structure 220-1 buried inside the substrate 120 comprises the buried conductive layer 200 along with the vias 240-1, 240-2 being coupled in parallel to the buried conductive layer 200. The electrical contact structure 200-1 may, therefore, form one portion of an electrical contact structure to electrically contact the magneto-resistive structure 110. To allow the CPP configuration to be established, the device further comprises a further electrical contact structure 220-2 arranged on top of the magneto-resistive structure 110. As indicated by a schematically drawn wire, the further electrical contact structure 220-2 may be used to provide a current and/or a voltage to the magneto-resistive structure 110 or to extract a current from it. As a consequence, during operation a current may flow essentially perpendicular to the layer arrangement of the magneto-resistive structure 110 as indicated by the arrow 210. Naturally, instead of a TMR magneto-resistive structure 110, also a GMR structure or another XMR structure may be used.

Figure 4:
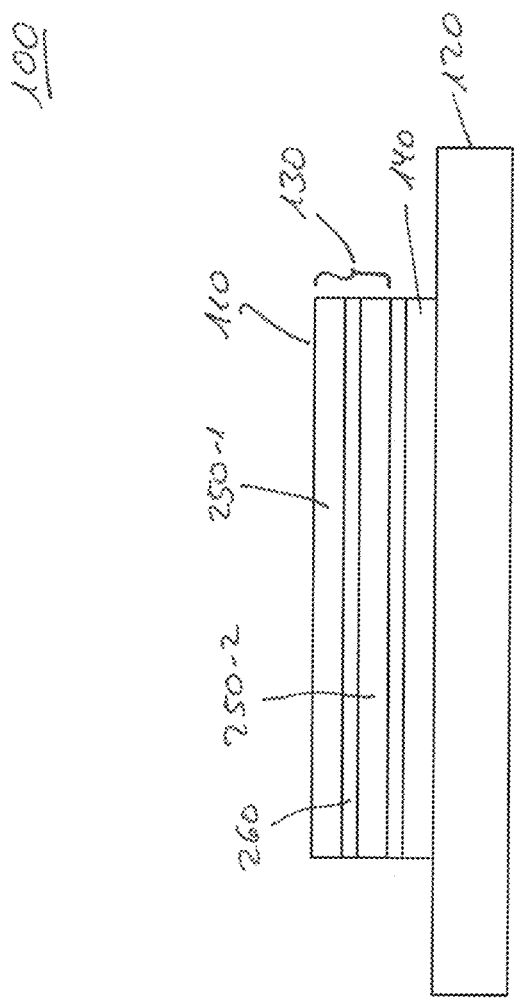
FIG. 4 shows a schematic cross-sectional view of a device comprising at least two ferromagnetic layers.

FIG. 4 shows a schematic block diagram of a device 100 comprising a magneto-resistive structure 110 deposited on a substrate 120. The magneto-resistive structure 110 comprises a magnetic free layer 130 with an in-plane closed flux magnetization pattern. The magnetic free layer 130 comprises at least two ferromagnetic layers 250-1, 250-2, which are separated by an electrically insulating layer or a magnetic coupling layer 260. Naturally, in other examples, the magneto-resistive structure 110 may further comprise an optional magnetic reference layer 140, which may once again be separated from the magnetic free layer 130 by a layer being electrically conductive or non-conductive depending on the technology involved. The layer arranged in between the magnetic free layer and the magnetic reference layer 140 may, for instance, comprise a magnetic pattern of its own, which may, for instance, be induced by an interaction of the magnetic free layer 130 and/or of the magnetic reference layer 140 arranged above or below, respectively.

However, in other examples of a device 100 different arrangements may be used. For instance, the number of ferromagnetic layers 250 along with a corresponding number of layers 260 reduced by one compared to the number of ferromagnetic layers 250 may be implemented.

Figure 5:
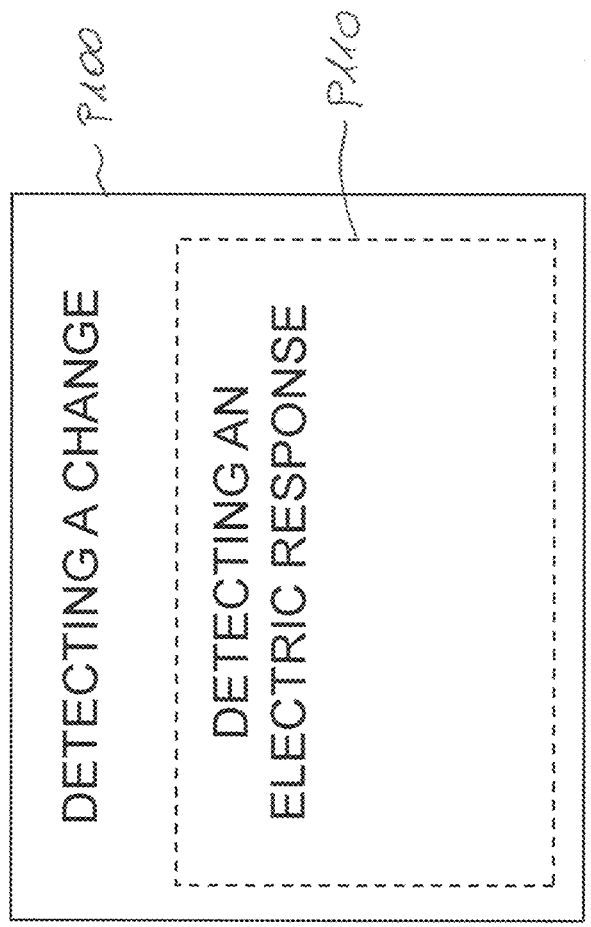
FIG. 5 shows a block diagram of a method according to an embodiment.

FIG. 5 shows a flowchart of a method comprising, in a process P100 detecting a change of a spontaneously formed in-plane closed flux magnetization pattern in a magnetic free layer 130 in reference to a magnetic reference layer having a non-closed flux magnetization pattern. Optionally, detecting the change may comprise, in a process P110, detecting an electrical response of a magneto-resistive structure 110 comprising the magnetic free layer 130 and the magnetic reference layer 140.

However, the implementation details as described, for instance, with reference to FIGS. 1 to 4 may be freely combined with each other. The same also applies to examples of devices 100, which will be described below in more detail.

In terms of the method as described in context with FIG. 5, the circuit 160, which may be optionally implemented, may be configured to perform such a method. In other words, operations and processes described in context with a circuit 160 may, for instance, be implemented in a method and vice-versa.

Although in the following many examples will be described in the context of automotive applications, and to be even more precise in the context with speed sensors, devices 100 are by far not limited to these applications. Moreover, many of the following examples are described based on GMR structures as one example of a magneto-resistive structure 110. However, it is to be noted that also other magneto-resistive techniques may be employed with a framework of the magneto-resistive structure 110 and the further magneto-resistive structure 170 such as the tunneling magneto-resistive (TMR) effect, the anisotropic magneto-resistive (AMR) effect, the extraordinary magneto-resistive (EMR) effect and other similar magneto-resistive effects. Unless explicitly described, in principle any magneto-resistive technology may be operated in both a current-in-plane configuration (CIP configuration) having primarily a current flow parallel to the larger extensions of the layers of the respective magneto-resistive structures 110, 170 and in a current-perpendicular-to-plane configuration (CPP configuration) having at least partially a direction of current flow perpendicular to the layers of the magneto-resistive structures 110, 170. Depending on the implementation and the effect used, a change of the electric response may be larger or smaller depending on the effect and the configuration involved.

In the automotive section, many of today's magneto-resistive based speed sensors are used in context with a magnetic pole wheel as a transducer wheel. The transducer pole wheels typically have only a limited thickness or axial width. Therefore, a signal produced by a magnetic sensor may depend on the mechanical mounting position.

Figure 6:
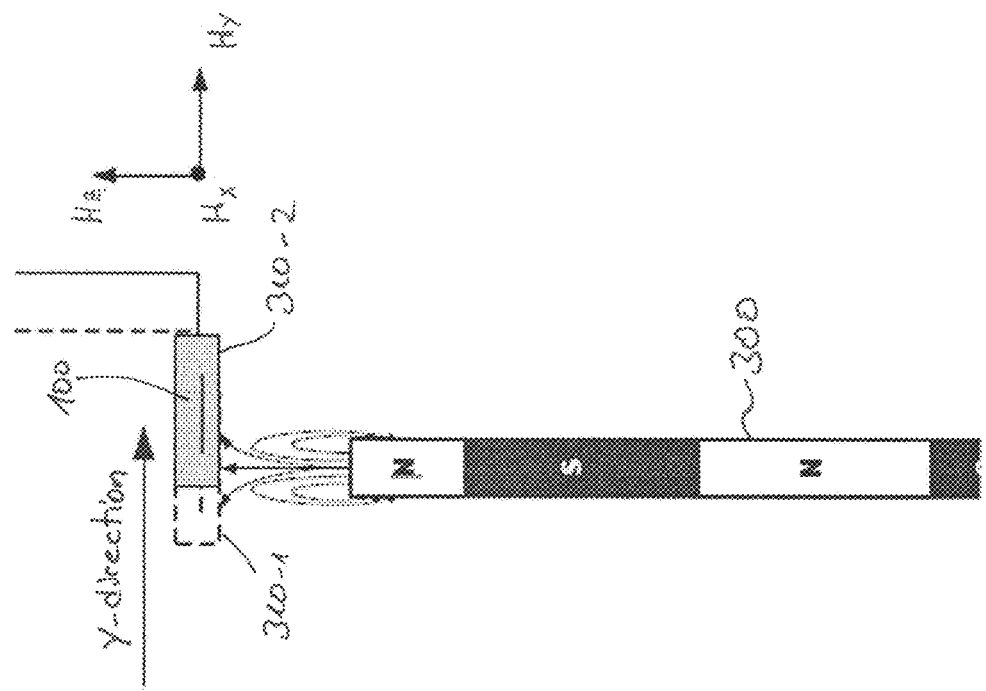
FIG. 6 illustrates a position of a device with respect to a pole wheel.

FIG. 6 illustrates the situation schematically. FIG. 6 shows a situation of a magnetic pole wheel 300 having alternately arranged magnetic north poles and magnetic south poles denoted in FIG. 6 by the letters N and S, respectively. FIG. 6 further illustrates two positions 310-1, 310-2 of a device 100 with respect to the pole wheel 300. The different positions 310 differ with respect to a displacement along a y-direction, a magnetic field component along the y-direction (Hy) will depend on the relative position 310 of the device 100 with respect to the pole wheel 300.

Figure 7:
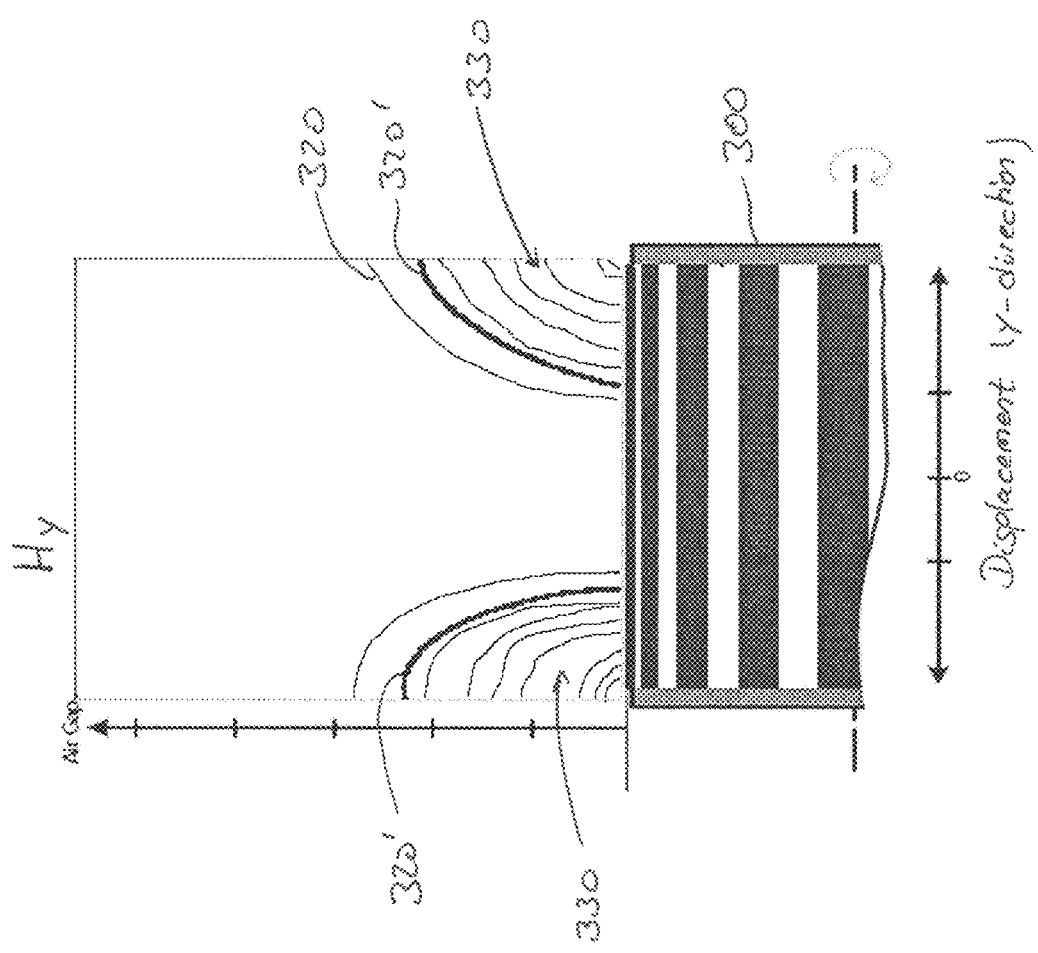
FIG. 7 illustrates a Fly-field component of a magnetic field created by a pole wheel.

FIG. 7 schematically shows the y-component (Hy) of the magnetic field created by the pole wheel 300 as a function of the displacement along the y-axis regarding the center of the pole wheel 300 and as a function of a distance between the pole wheel 300 and the positions 310 of the device 100, in other words as a function of the air gap between the pole wheel 300 and the device 100 along the z-direction.

The alternately arranged magnetic poles of the pole wheel 300 are illustrated in FIG. 7 by dark and light stripes, wherein the dark stripes correspond to south poles, while the light stripes correspond to north poles, as already indicated in FIG. 6.

The pole wheel 300 is sometimes also referred to as an encoder wheel. The magnetic field strength along the y-direction (Hy) is indicated in FIG. 7 by lines 320 indicating positions in the y-z plane having equal or with respect to margin of error similar Hy-values. One of the lines 320, line 320' illustrates a typical limit of a magnetic field component along the y-direction, which may hamper an operation, or at least an accuracy achievable by a device 100. An area 330 below and more off-centered (away from y=0) may, therefore, hamper an accuracy achievable by a device 100 or even an operation of a device 100.

Apart from the magnetic field component along the y-direction, the magnetic pole wheel 300 also creates a magnetic field component along the x-direction which is referred to as a fix field amplitude. The Hx and Hy field amplitudes generated by the transducer wheel or pole wheel 300 may, for instance, be shifted in phase by approximately 90°. This may result in the rotation of the detected magnetic field vector in a device 100.

Figure 8C:
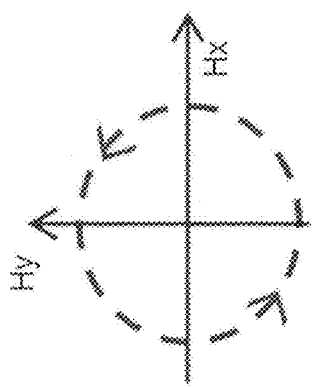
FIG. 8c illustrates a detected magnetic field created by the pole wheel in a further off-centered position.
Figure 8B:
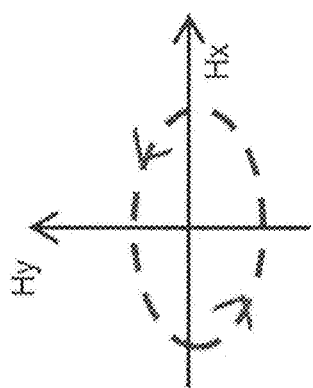
FIG. 8b illustrates a detected magnetic field created by the pole wheel in a first off-centered position.
Figure 8A:
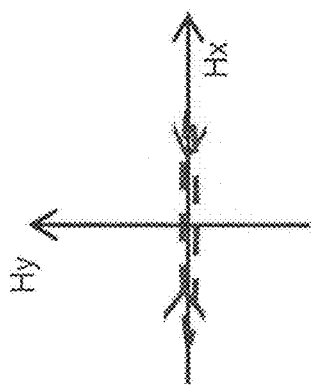
FIG. 8a illustrates a detected magnetic field created by the pole wheel in a centered position.

To illustrate this, FIG. 8a shows a distribution of the magnetic field detected by a device 100, when the device 100 is in the magnetic center position (y=0) with respect to the pole wheel such that the y-component of the magnetic field along the y-direction Hy vanishes (Hy=0). FIG. 8b illustrates a situation when the device 100 is in an off-centered position such that the y-component of a magnetic field Hy corresponds to half that of the x-component (Hx; Hy=Hx/2). Similarly, FIG. 8c illustrates an off-center position of a device 100, in which the magnetic field component along the y-direction (Hy) is equal to that of the x-direction (Hx; Hy=Hx).

In other words, FIGS. 6, 7, 8a, 8b and 8c illustrate that a Hy field component may depend on the sensor mounting position 310. For a magnetically centered magneto-resistive element, the magnetic field component along the y-direction Hy may approximately be 0 (Hy=0 mT). However, for off-centered elements and devices 100, an Hy-field amplitude may increase. FIG. 8c illustrates a less favorable situation with magnetic field components Hx, Hy having the same amplitude.

Figure 9:
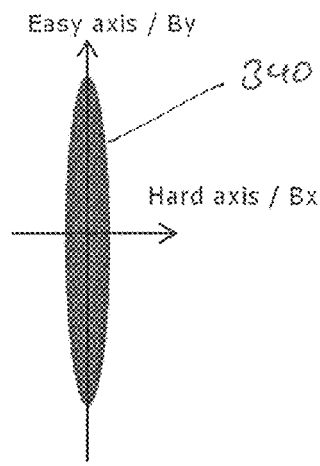
FIG. 9 illustrates an elongated magneto-resistive structure.

Conventional magneto-resistive structures are usually narrow-stripe shaped structures, such as rectangular stripes, ellipses or other similar shapes with a width of less than 2 µm in order to provide a so-called shape anisotropy. FIG. 9 illustrates such a conventional magneto-resistive structure 340, which may, for instance, be used as a magnetic reference layer 140 or further magnetic reference layer 190 in a device 100. The magneto-resistive structure 340 comprises an elongated structure or shape. The magneto-resistive structure 340 may, for instance, comprise an extension along a first direction, which is referred to in FIG. 9 as an easy axis being at least 2× larger than an extension along a direction perpendicular to the easy axis but area also arranged in the plane of the magneto-resistive layered structure 340. This second direction is also referred to as the hard axis. However, the extension along the easy axis may also be at least 5× or at least 10× that of the hard axis.

Due to the previously-mentioned shape anisotropy, for energetic reasons the film magnetization tends to align along the length of the elongated structure or, in other words, along the easy axis giving this effect and the axis their names. As a result, there is the so-called easy axis and the so-called hard axis, the latter one being typically perpendicular to the easy axis or the axis of the shape anisotropy.

The concept of shape anisotropy may be very useful for the case of a perfect mounting position having a magnetic field component along the y-direction, which vanishes (Hy=0 mT). In this case, the shape anisotropy defines the orientation of a free layer during the zero crossing of a magnetic input signal. However, this may lead to less favorable effects in combination with a rotating field vector. To be more precise, discontinuities may occur in the magneto-resistive or GMR output signal, which may give rise to a signal jitter. The relation between shape anisotropy and such a signal jitter can, for instance, be explained by the Stoner-Wohlfarth theory.

Furthermore, static magnetic fields having a component along the y-direction (By-fields) may lead to a decrease of sensitivity to magnetic fields along the x-direction. Magnetic fields along the y-direction may be, for instance, caused by a back-biased magnet for ferrous wheel applications. Due to these By-fields, the magnetization of a free layer tends to align with a direction resulting from a vector addition of the static By and the Bx component. As a consequence, the sensitivity to the Bx-field may be reduced. The sensitivity variation due to the static By-field may be a problem especially for applications concerning wheel or engine speed, in which back-biased magnets in combination with ferromagnetic tooth wheels may be used. As will be outlined below, examples of a device 100 may reduce or even completely avoid by design similar discontinuities in the output signal and, therefore, reduce a By-field influence on the sensor sensitivity and an achievable accuracy.

To avoid such discontinuities, the so-called geometric averaging approach may be used, which still keeps the concept of shape anisotropy, but employs a serial and/or parallel connection of magneto-resistive elements of different geometry leading to an averaging effect and, therefore, to a reduction of the signal jitter. However, although geometric averaging may reduce the observed signal jitter, some applications may require in terms of signal jitter, values going further down for which this approach may not be feasible. A device 100 may overcome this limit as will be outlined below in more detail.

Examples of devices 100 use a special design for magneto-resistive elements or structures 110 which have a defined magnetization at an externally vanishing magnetic field (Hext=0) like magneto-resistive elements based on shape anisotropy. However, the difference with respect to more conventional designs as the one shown in FIG. 9, may be that no switching of the the free layer magnetization from one half-space to the other occurs. To be more precise and as outlined before, a device 100 may be based on a magnetic free layer with a spontaneously generated in-plane closed flux magnetization pattern, which, for instance, may comprise at least partially one of at least a Landau pattern, a circumferential pattern and a vortex pattern. The closed flux magnetization pattern may essentially be a single in-plane closed flux magnetization pattern.

Figure 10:
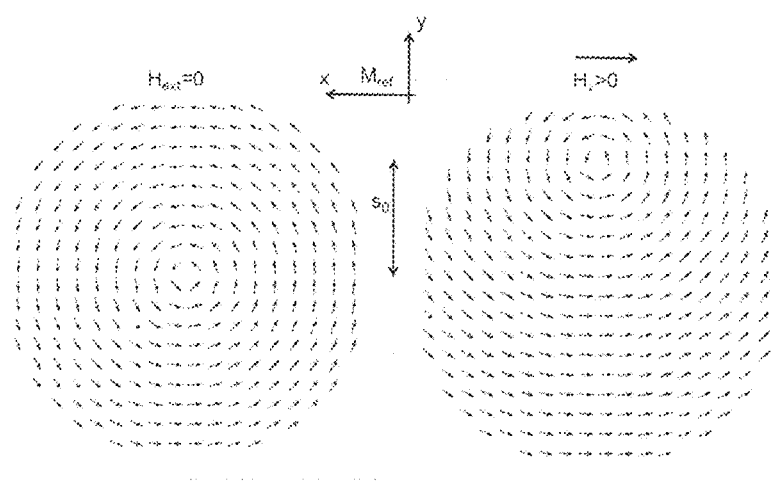
FIG. 10 illustrates an in-plane closed flux magnetization pattern and a shifted version thereof.

An example is shown in the left part of FIG. 10, showing a circumferential magnetization of the free layer 130 having a vortex or vortex-like configuration or magnetization. In a vanishing external magnetic field (Hext=0), a center of the vortex may be essentially located at a center of the magnetic free layer 130 such that a net magnetization of the respective magnetic free layer essentially vanishes. Devices employing such a magnetic free layer 130 may, for instance, be referred to as vortex magneto-resistive structures, or for instance in the case of a GMR device, a vortex GMR.

As outlined before, the magnetic free layer may be designed in such a way that the in-plane closed flux magnetization pattern shown, for instance, in the left part of FIG. 10, is spontaneously generated. In other words, in the case of an absence of an external magnetic field, the magnetic field configuration of an in-plane closed flux magnetization pattern may represent the basic level of the respective system. When an external magnetic field, for instance, along the x-axis is applied (external Hx field), the core or center of the vortex is shifted along the y-axis as indicated in the right part of FIG. 10 by a distance S0. Similarly, by applying an external field along the y-axis (external Hy field), the vortex core is shifted along the x-axis (not shown in FIG. 10). For the case of a fully symmetric vortex disc and the unidirectional magnetized magnetic reference layer along the x-direction, the signal or electric response of the magneto-resistive structure may be sensitive to magnetic fields along the x-direction (Hx field) only. This situation is depicted in the right part of FIG. 10, showing the situation when the core or center of the vortex moves along the y-direction along a distance S0. This causes a net magnetization for Hx being larger than 0 mT.

It is to be noted that the external fields only shift the vortex core. In contrast to more conventional approaches employing stripe-shaped structures, no re-magnetization against the shape anisotropy during the operation occurs. As a result, discontinuities and signal jitter in the sensor signal may be reduced or can even disappear. In other words, without employing shape anisotropy for the free magnetic layer 130, at least one root cause for the appearance of signal jitter may be cancelled out. Devices 100 may use this effect to improve the previously-mentioned trade-off.

Figure 11:
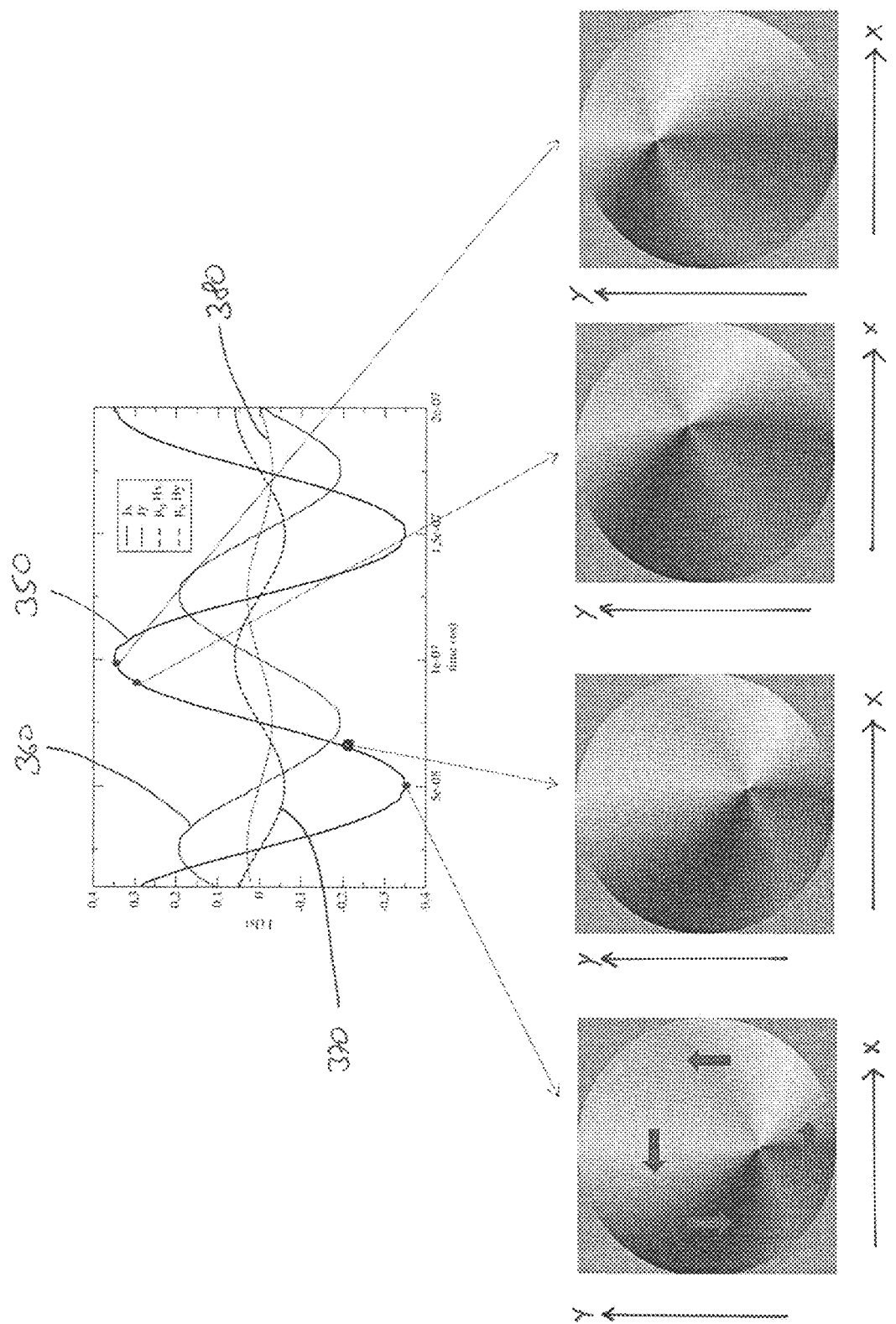
FIG. 11 illustrates a magnetization in response to an external magnetic field in a magnetic free layer with an in-plane closed flux magnetization pattern.

FIG. 11 illustrates a vortex core movement for a rotating field. An upper part of FIG. 11 shows a magnetization curve 350 along an x-direction, a magnetization curve 360, along a y-direction, and an external magnetic field 370 along an x-direction and an external magnetic field curve 380 along a y-direction as a function of time for a magnetic free layer for an in-plane closed flux magnetization pattern as depicted in the lower part of FIG. 11. To be more precise, the lower part of FIG. 11 shows four consecutive configurations of the magnetization of the magnetic free layer at states illustrated by dots in the upper part of FIG. 11. The first diagram in the lower part of FIG. 11 corresponds to a situation when due to the external magnetic field acting in the x-direction a net magnetization along the (negative) x-direction exists, which is caused by the vortex moving downwards in FIG. 11 in the lower part. The rightmost part of FIG. 11 corresponds to a situation which is essentially opposite to the one on the left part, in which due to the external magnetic field acting in the x-direction, the net magnetization of the free magnetic layer is essentially directed into the (positive) x-direction.

The two figures in between illustrate a situation where due to an existing y-component of the external magnetic field, the core of the vortex not only moves along the y-direction, but also along the x-direction. This leads to a smaller net magnetization in the y-direction.

In other words, FIG. 11 illustrates the vortex movement. When, the external magnetic field along the x-direction (Hx) is applied to the vortex, the core is shifted in the y-direction and an average magnetic moment in the x-direction is increased.

However, the question remains how to reach a circumferential magnetization such as a vortex in a magnetic free layer material of a magneto-resistive structure. The magnetization in a soft magnetic material tends to be oriented in a way such that a total energy comprising an exchange energy, an anisotropy energy, stray field energy, Zeeman energy and other energy contributions, is minimized. In the absence of an external magnetic field this defines the ground states.

It turns out that for specific geometries in combination with specific layer thicknesses of a certain material, a circumferential magnetization such as a vortex may be energetically favored. Typical configurations to achieve such spontaneous vortex magnetizations may, for instance, comprise diameters between 100 nm up to 5000 nm (5 µm) with free layer thicknesses between 1 nm and 50 nm, to name just a few examples.

The magneto-resistive structure 110 may be designed differently concerning shape, lateral dimensions, thicknesses, materials and other parameters. Many configurations show in a ground state a vortex-like configuration. However, not all vortex-like configurations show the same magnetic characteristic.

Figure 12:
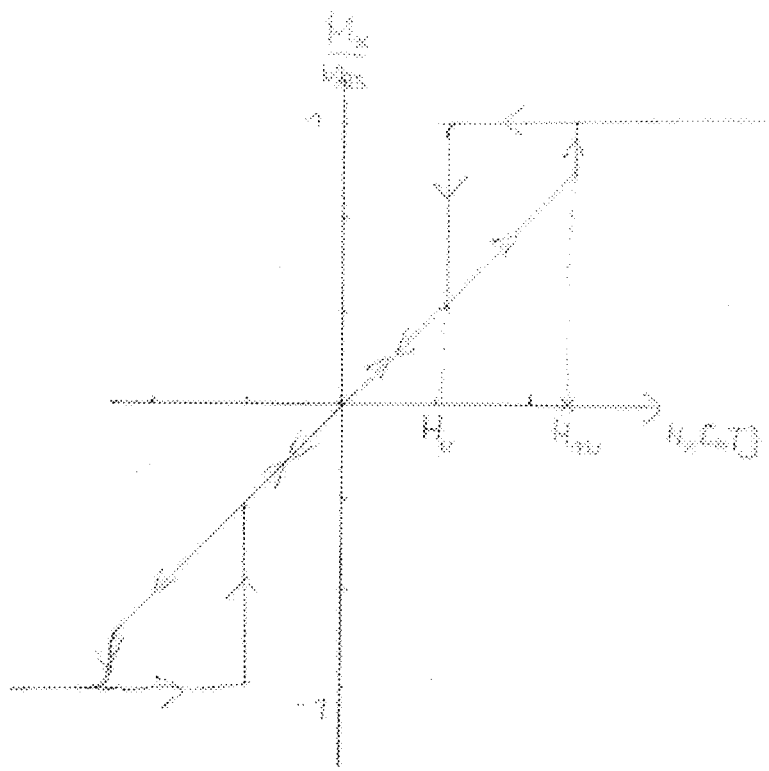
FIG. 12 shows a transfer function of a magnetic free layer with an in-plane closed flux magnetization pattern.

FIG. 12 shows a characteristic of an in-plane closed flux magnetization pattern, for instance for a vortex or vortex-like configuration. Starting from the origin (Hx=0 mT and Mx=0) by increasing or decreasing the external magnetic fields (Hx) also the magnetization Mx increases essentially linearly until an annihilation field Han is reached. Once the annihilation field Han is reached, the magnetization Mx is reached as a saturation value, which is also kept during a reduction of the external magnetic field. However, when the external magnetic field Mx reaches nucleation fields Hn, the closed flux magnetization pattern is reformed and the magnetization Mx drops down to the essentially linear characteristic. Typically, the annihilation field Han is larger than the nucleation field Hn. However, in the range between the nucleation field Hn and the annihilation field Han, the magnetization Mx still follows the essentially linear characteristic essentially hysteresis-free.

The characteristic as shown in FIG. 12 is essentially symmetric with respect to the origin (Hx=0; Mx=0). Therefore, not only by increasing the external magnetic field the magnetization Mx changes accordingly, but also by decreasing the external magnetic field or applying the external magnetic field in the opposite direction, the magnetization follows with the opposite direction.

The transfer function as shown in FIG. 12 of a magnetic structure with a vortex magnetization is, in other words, maybe very linear around 0 magnetic field Hx=0. When the external field Hx reaches a certain limit called annihilation limit Han, the core of the vortex touches the border of the structure and the vortex magnetization is destroyed in favor of a more unidirectional magnetization along the external field direction. The situation is described in FIG. 13.

Figure 13:
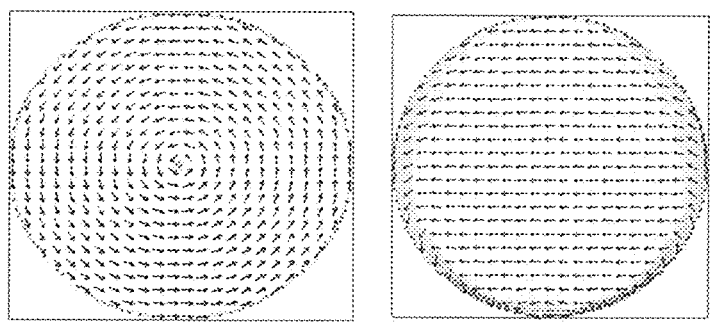
FIG. 13 illustrates in a left part an in-plane closed flux magnetization pattern and in the right part the pattern shown in the left part being destroyed by an external magnetic field.

FIG. 13 shows in a left part a vortex magnetization, for instance, at a vanishing external magnetic field Hx=0 mT. In contrast, in a right side of FIG. 13, the vortex structure has been destroyed or annihilated due to a too high magnetic field exceeding the annihilation field or limit Han. For instance, the simulation, the results of which are shown in FIG. 13 on the right side, is based on an external magnetic field of −50 mT.

If the field strength is again reduced, the vortex magnetization may be forming spontaneously again, where the nucleation field Hn is undershot. Typically, the annihilation field Han and the nucleation field Hn will not have the same value. However, it may be the case that the annihilation field Han and the nucleation field Hn may have identical or at least very similar values such that during operation the fields appear to be identical.

The region between the annihilation field Han and the nucleation field Hn is covered by hysteretic behavior. Especially for speed sensor applications, where is a switching signal is generated by the sensor around H=0 mT, it may be therefore possible to operate such a design to be always kept in a vortex state during the signal generation. When the external field keeps below the annihilation field Han, the transfer function may be considered to be basically free of hysteresis.

Figure 14:
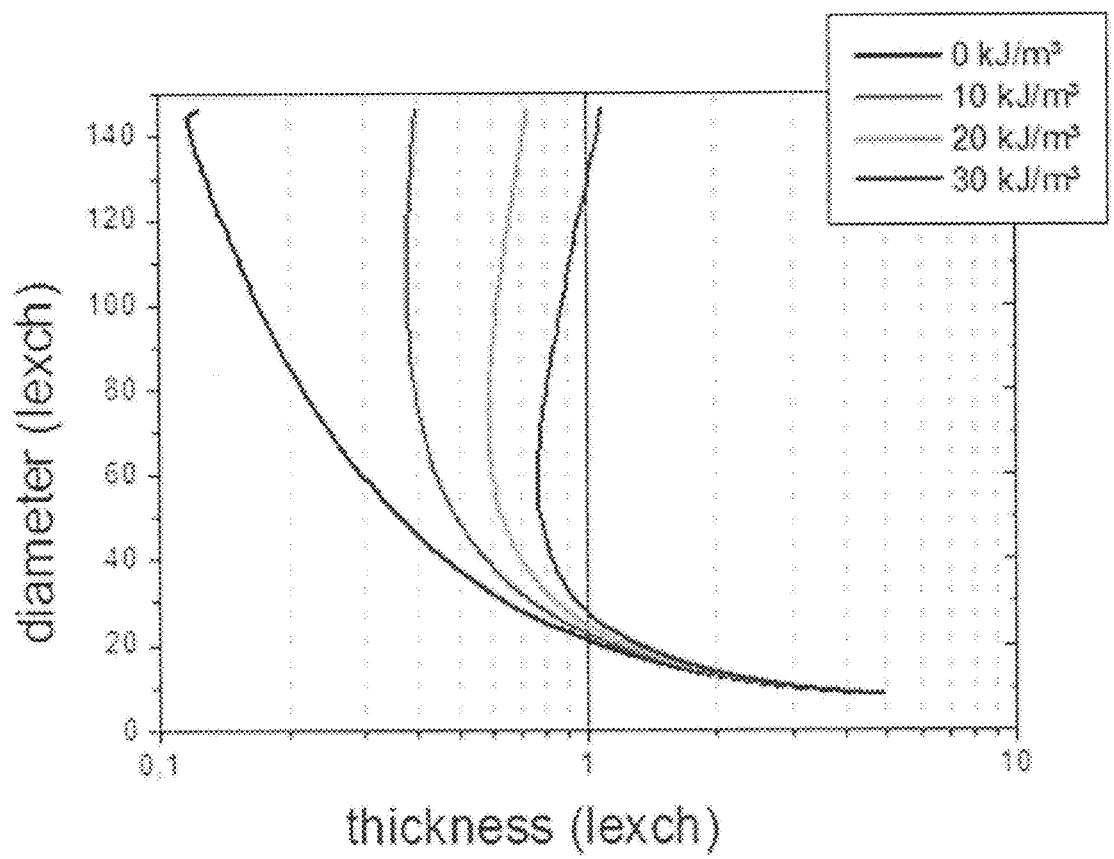
FIG. 14 shows simplified phase diagrams for a magnetic free layer with a spontaneously-generated in-plane closed flux magnetization pattern.

FIG. 14 shows a simplified phase diagram of a magnetic free layer as a function of a thickness and diameter in units of an exchange length lexch. For soft magnetic materials the exchange length can be approximated as $lexch=(A/(Js^2/\mu0))^{0.5}$, where A is the exchange constant and Js the magnetic polarization. $\mu_0=4\cdot\pi\cdot 10-7$ V s/(A m) is the vacuum permeability. In more general terms, the exchange length lexch may be defined as $lexch=\min((A/K_1)^{0.5}, (A/(Js^2/\mu0))^{0.5})$, where min ( . . . ) is the minimum function and $K_1$ is the anisotropy constant.

FIG. 14 shows for four different uniaxial anisotropy energies between 0 kJ/m³ and 30 Kj/m³ four permalloy discs having an exchange length lexch of approximately 5.88 nm. Above and right to the lines shown in FIG. 14 a vortex state exists, while below the lines a single domain state is the preferred state.

Based on the phase diagrams shown in FIG. 14, based on a diameter of a disc fabricated, for instance, from permalloy, a critical magnetic field can be deduced such as the annihilation field Han or the nucleation field Hn. Depending on the diameter of the disc, annihilation fields Han of more than 100 mT may be achievable. The smaller the diameter is, the higher the annihilation field Han and the larger the nucleation field Hn becomes.

A device 100 may therefore comprise, for instance, a single vortex magnetized free layer with a spontaneously formed vortex magnetized free layer at 0 mT and a nucleation field Hn being larger than 0 mT. It may further comprise, for instance, a unidirectional homogeneous magnetized reference system (magnetic reference layer 140) along an axis, for instance, not having a vortex magnetization.

Such a device may in principle be operated in a CIP or CPP configuration. The magneto-resistive structure 110 may be based, for instance, on AMR, GMR or TMR technology. The annihilation magnetic fields Han may, for instance, be in the range between 5 and 100 mT, while the nucleation field Hn is typically smaller than the annihilation magnetic field Han, but larger than 100 µT. The magnetic free layer 130 may, for instance, comprise a material thickness between 1 nm and 50 nm to name just one implementation. The free layer may further comprise a structure size between 100 nm and 5 µm. The free layer may comprise a non-elongated lateral shape such as a circle, a triangle, a square or a similar polygonal form.

As will be laid out in more detail below, such a single vortex element may, for instance, comprise an electrical connection. A current distribution may, for instance, be designed to be parallel or anti-parallel to the magnetic reference direction or net magnetization of the magnetic reference layer 140. Using this approach, the electrical connection may be used to increase the sensing effect.

Depending on the technology involved, it may be advisable to use more than just one magneto-resistive structure 110, which may, for instance, be coupled or connected in series having two or more elements. Naturally, magneto-resistive structures 110 may be coupled into a Wheatstone bridge configuration.

In the following, some implementations will be described on the basis of the giant magneto-resistance (GMR) effect. The relative resistance change in such a GMR structure as one example of a magneto-resistive structure 110 may be described approximately by $$(R(H)/R_{11})/R_{11}=GMR_0/2\cdot(1-M(H)/M_S) \quad (1)$$

In equation (1), $GMR_0$ is the total relative amplitude of the resistance change, while M(H) is the magnetization in response to the external magnetic field H and $M_S$ is the saturation magnetization. The total relative amplitude $GMR_0$ is given by $$GMR_0 = (R_{\uparrow\downarrow}/R_{\uparrow\uparrow}) - 1, \quad (2)$$

wherein $R_{\uparrow\downarrow}$ and $R_{\uparrow\uparrow}$ are the resistances in antiparallel and parallel magnetization configuration of the free layer and the reference layer, respectively.

For sensor applications, the total resistance and the sensitivity may be decisive for the performance. The total resistance change of a circular disc may, for instance, be crucially determined by the relative position of the contact vias or pads relative to the fixed reference magnetization of the pinned layer (magnetic reference layer 140) and the external field direction. For instance, while magnetization components may be oriented +90° or −90° to the reference magnetization, delivering the same resistance, any redistribution of these magnetization contributions typically does not result in any resistance change. Therefore, the sensitivity with respect to Hy fields may be small or even minimal.

The resistance response to Hx fields, on the other hand, may be significantly larger. Any redistribution of spin, shares in parallel or antiparallel direction, for instance, by applying a magnetic field along the x-direction, may result in a resistance signal. A linear shift of the vortex center gives approximately a linear resistance output. Therefore, in the linear regime, the transfer curve in terms of resistance may be similar to the transfer function shown in FIG. 12. The transfer curve may, for instance, be approximately linear with respect to a vortex core relative shift $S_0/R$ wherein R is the radius of a disc forming the magnetic free layer 130.

It is to be noted here that in many applications S0 depends linearly on the applied field only for small shifts. The exact shift and transfer curve may therefore, be more complex and determined by the magnetization pattern of the vortex state.

Figure 15:
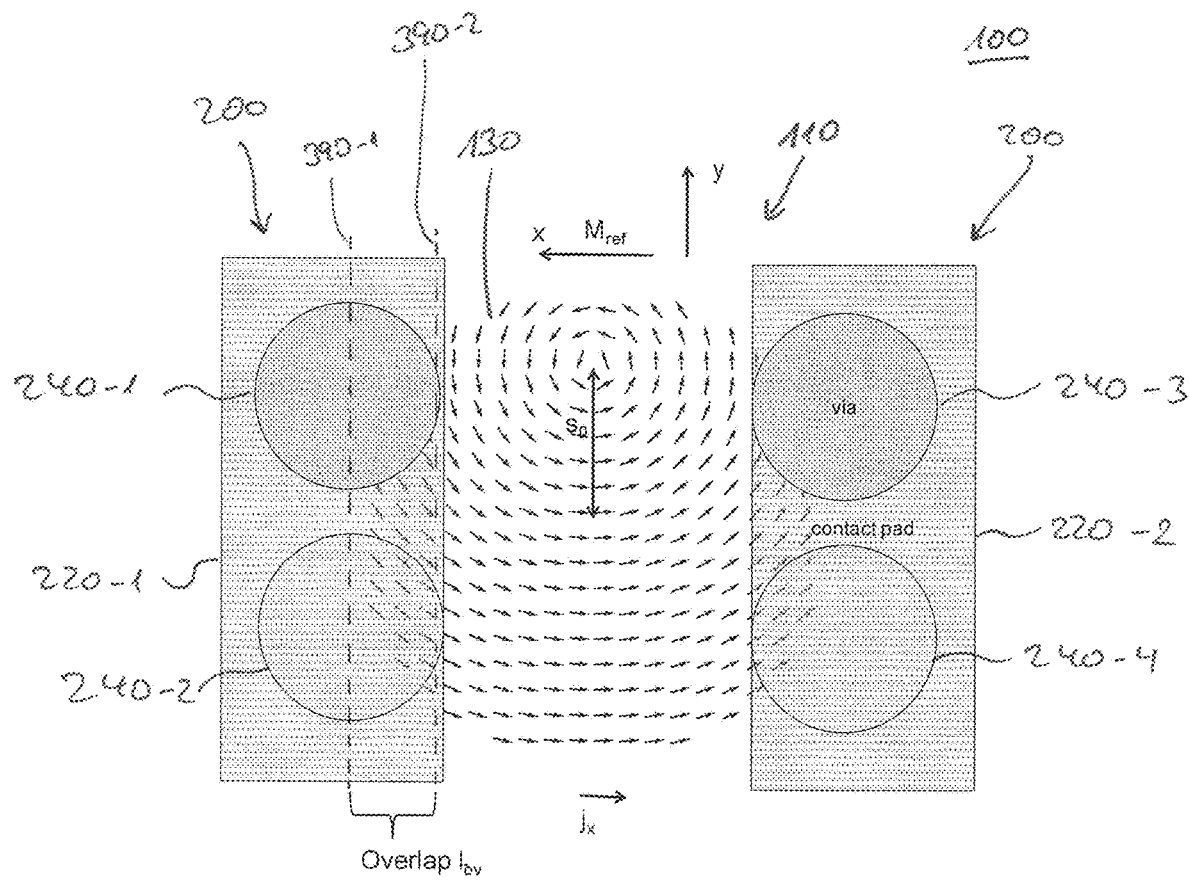
FIG. 15 shows a simplified plan view of a device.

FIG. 15 shows a schematic layout of an electrical contact of a device 100 comprising a single vortex GMR element or magneto-resistive structure 110. For the sake of simplicity only, in FIG. 15, the magnetic reference layer 140 is not shown. Only its reference magnetization Mref is indicated, which is aligned along the x-direction. The magnetic free layer 130 is essentially disc shaped and illustrated by a field of arrows indicating the magnetization or magnetization pattern of the magnetic free layer 130. Due to an external magnetic field acting in the direction of the negative x-direction, a center of the vortex is shifted by $S_0$ as indicated in FIG. 15 along the y-direction.

The device 100 further comprises an electrical contact structure 200 which is capable of injecting a current Jx along the x-direction as indicated in FIG. 15. The electrical contact structure 200 comprises two buried conductive layers 220-1, 220-2 for providing and extracting the electrical contact to the magnetic free layer 130, respectively. As described in the context of FIG. 3a, the buried conductive layers 220 are arranged inside the substrate 120 (not shown in FIG. 15). To electrically contact the hermetic free layer, the electrical contact structure 200 comprises on each side of the magnetic free layer 130 two vias 240-1, 240-2 and 240-3, 240-4, respectively. An overlap of the vias 240 and the magnetic free layer 130 lov is given by a distance between two straight lines 390-1, 390-2, which are both perpendicular to a net magnetization of the magnetic reference layer 140 and define a border of the magnetic free layer 130 and the vias 240—or in more general terms—of the electrical contact structure 200 being in direct electrical contact with the magnetic free layer 130.

To put it in different terms, the electrical contact structure 200 is electrically contacted to the magneto-resistive structure 110 such that the electrical contact structure comprises an overlap with a magnetic free layer 130. The overlap may be in a plane or parallel to the magnetic free layer 130 along a direction parallel or antiparallel to the net magnetization of a magnetic reference layer 140. In other words, the reference may be along a direction parallel or antiparallel to the net magnetization of the magneto-resistive structure 110 provided, for instance, by the magnetic reference layer 140.

The overlap may, for instance, be at the most 30% of a minimum radius of a circle fully comprising the magnetic free layer 130. In other words, when the magnetic free layer 130 is circular shaped, the minimum radius corresponds to the radius of the magnetic free layer 130. However, in case of another shape of the magnetic free layer 130, reference may be made, for instance, to the minimum radius of a circle fully comprising the magnetic free layer 130.

In other examples of the device 100 the electrical contact may be arranged to touch or to be arranged outside any of the magnetic free layer 130 or a projection thereof.

As already described, the electrical contact structure 200 may be arranged such that the magneto-resistive structure 110 is electrically contacted to enable a current flowing through the magneto-resistive structure 110 essentially parallel or antiparallel to a direction of the net magnetization of the magnetic reference layer.

Due to the electrical conductivity, which is typically better for the materials used for vias and the buried conductive layers 220, the electrical contact may short circuit at least parts of the magnetic free layer 130. For instance, an overlap of 10% of the disc radius in the case of a circular magnetic free layer 130 may result in an area loss of approximately 3%. An overlap of 30% of the radius of the disc may result in an area loss of approximately 18%. Along with the area loss, a total resistance of the magneto-resistive structure 110 may also drop. However, the GMR value may be affected only slightly. Surprisingly, depending on implementation details, the GMR value may even increase with increasing overlap.

For instance, based on a sheet resistance of a GMR stack with 20 nm thick cobalt iron (CoFe) may be approximately 5Ω. A total resistance of a contacted disc may therefore yield approximately 4.5Ω or 3.5Ω for 10% or 30% overlap of the contacts, respectively. In order to achieve, for instance, 3 kΩ in total, a number of discs in series may be something like 667 or 857, respectively.

A total available area for a sensor layout may, for instance, be 800×50 μm². Based on contact holes having a diameter of approximately 500 nm and a minimal distance of 600 nm, a minimal distance between GMR elements may be approximately 1 μm. Assuming, for instance, a disc diameter of 1.5 μm, a total number of 320×20=6400 discs may be arranged or assembled in the available area. A more detailed layout will be given below.

Therefore, even using GMR technology, a total resistance and an averaging effect may be achievable, which gives application suitable parameters.

As the following discussion will also show, there are many different sensor element arrangements possible in order to realize a circumferential magnetization in the free layer 130. Beside the disc shape, also elliptic or rectangular shapes of the elements may be implemented. Basically, a vortex-like magnetization pattern may be reachable by arbitrary sensor element shapes. However, if the shape is given, a stable circumferential magnetization may be determined by the size of a sensor element and the thickness of the free layer. In the parameter space given by shape, size and layer thickness, a more or less large region can be defined in which a vortex or vortex-like magneto-resistive structure 110 may be realized.

The electrical contact structure 200 of a single element may be arranged to enforce the current distribution to be parallel or antiparallel to the unidirectional magnetic reference direction given by the magnetic reference layer 140. The electrical contacts of the single vortex or vortex-like magneto-resistive element may be provided by via connections in different shapes, for instance, based on circular shapes as shown in FIG. 15, long holes or short holes, as will be described in the context of FIGS. 16 and 17. However, also other styles of electrical contacts and via connections may be implemented. A via connection may, for instance, be designed to be only partly overlapping with the magneto-resistive structure 110, for instance, having an overlap of 1% to 100%.

In addition to the contact of a single sensor element as described above, a larger number of elements between one and several thousand, for instance more than $10^4$ elements, in order to reach a desired electrical resistance of a sensor may be implemented depending on the magneto-resistive technology involved. An electrical series connection of these elements may, for instance, be realized in different ways. Two examples will be outlined in the context of FIGS. 16 and 17 based on a vortex-like shape with an appropriate electrical connection.

Figure 16:
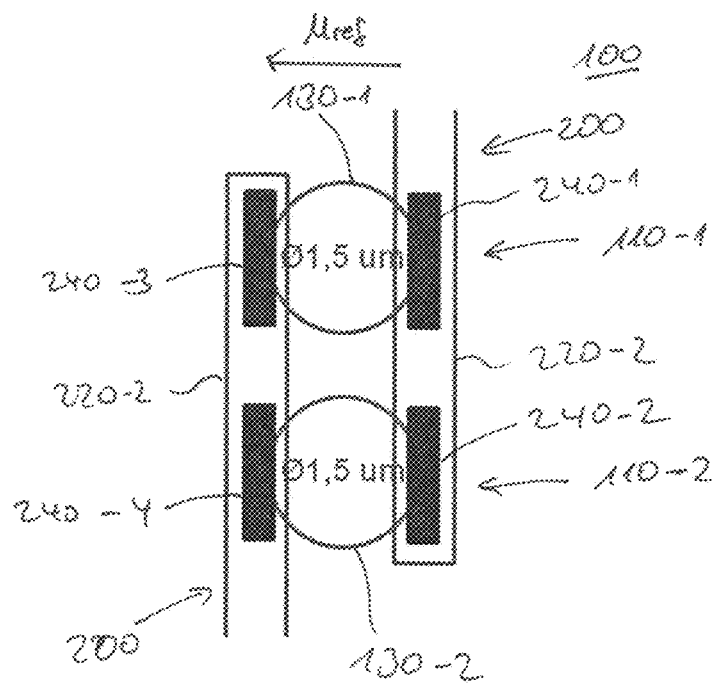
FIG. 16 shows a simplified plan view of a device.

FIG. 16 illustrates a plan view of a device 100 comprising two magneto-resistive structures 110-1, 110-2 coupled in parallel to one another. Once again, for the sake of simplicity, the magnetic reference layer 140 is not shown in FIG. 16. However, a reference magnetization is parallel to a y-direction indicated by an error in FIG. 16.

Each of the magneto-resistive structures 110-1, 110-2 comprises a magnetic free layer 130-1, 130-2, respectively. The magnetic free layers 130-1, 130-2 are coupled to a common electrical contact structure 200 comprising buried conductive layers 220-1, 220-2 by vias 240-1, . . . , 240-4. The vias 240 are implemented here as long vias overlapping with the magnetic free layers 130.

Figure 17:
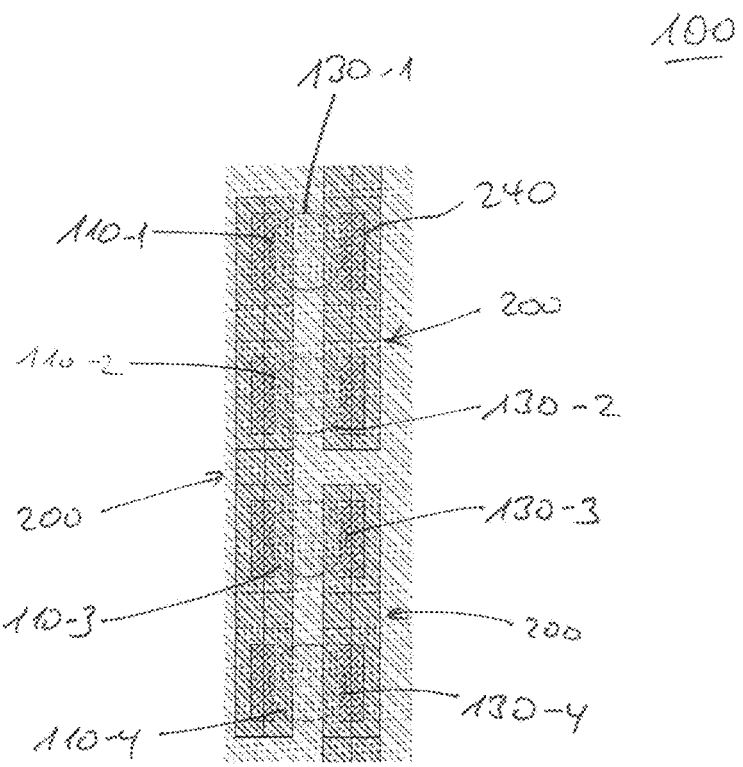
FIG. 17 shows a simplified plan view of a device.

FIG. 17 shows a similar structure compared to the one shown in FIG. 16. However, the device 100 or structure shown in FIG. 17 comprises four magneto-resistive structures 110-1, . . . , 110-4, which are coupled in series and in parallel. To be more precise, the magneto-resistive structures 110-1, 110-2 are coupled in parallel as are the magneto-resistive structures 110-3 and 110-4. Both groups of magneto-resistive structures are, however, coupled in series to one another. Also, the vias 240 of the electrical contact structures 200 are essentially identically shaped to the ones shown in FIG. 16.

Based on magneto-resistive structures 110 as previously described, it may be possible to realize devices in a well-defined way to realize electrical contacts of a GMR, a TMR or an AMR element to detect accurately a change of the magnetization. Based on the technology involved, it may be possible to improve the previously-mentioned trade-off including, for instance, accuracy. In other words, a device 100 may be capable of being used as a vortex-based magneto-resistive sensor element for an angle sensing element or the like.

Figure 18:
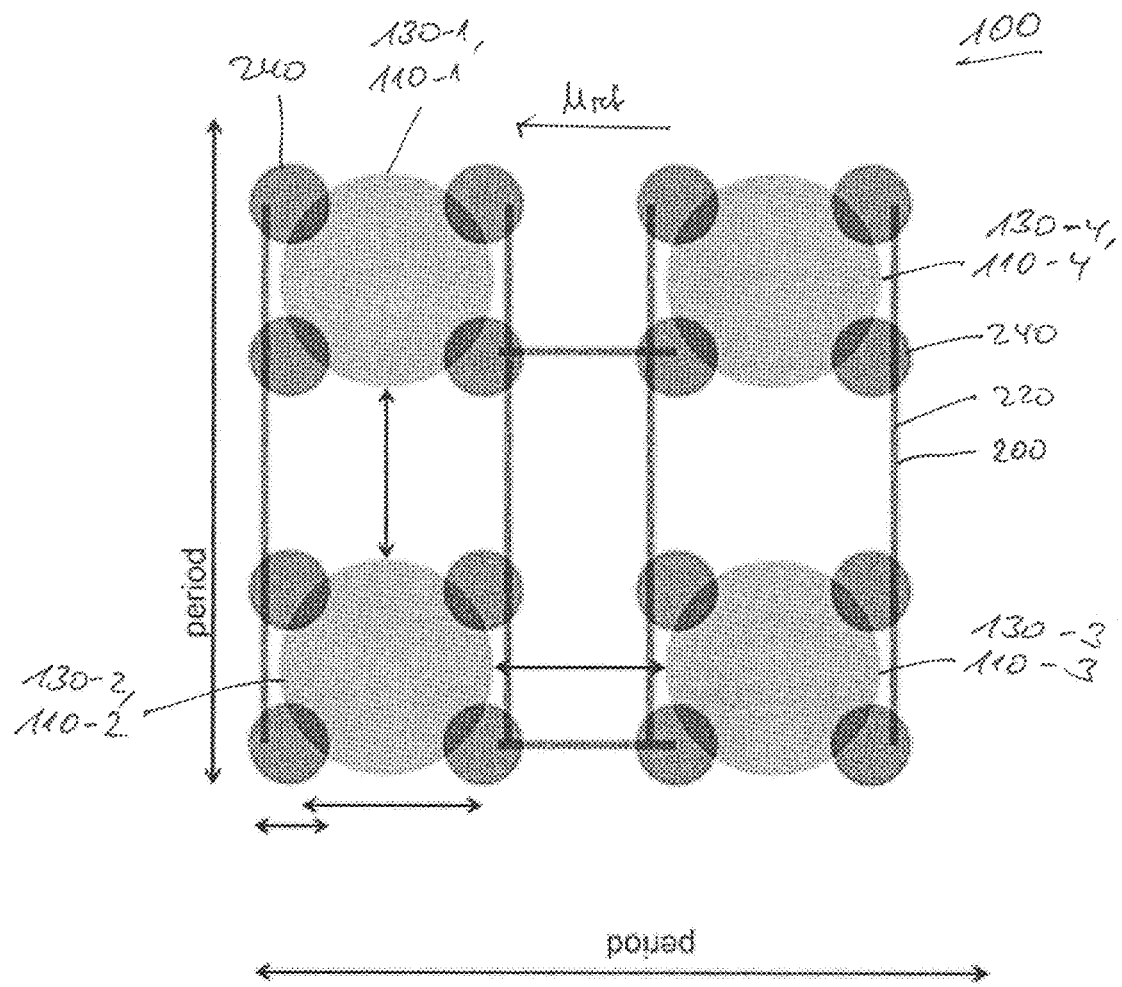
FIG. 18 shows a simplified plan view of a device.

FIG. 18 illustrates a further example of a device 100 which is quite similar to the one shown in FIG. 17. To be more precise, the device 100 schematically depicted in the simplified plan view also comprises four magneto-resistive structures 110-1, . . . , 110-4, each comprising a magnetic free layer 130, which is essentially disc-shaped, and a magnetic reference layer 140 which has been dropped in FIG. 18 for the sake of simplicity only. Once again, the magnetic reference layers 140 are arranged such that a net magnetization along a common direction is implemented as shown in FIG. 18 (Mref).

Once again, the electrical contact structure 200 comprises buried conductive layers 220 along with vias 240 having an overlap of approximately 30% with the magnetic free layers 130. For instance, the vias may comprise a diameter of approximately 0.5 μm while the magnetic free layers 130 may have a diameter of approximately 1.5 μm. Given a distance between the magnetic free layers 130 of approximately 1.5 μm, the structure shown in FIG. 18 may have a periodicity of approximately 6.0 μm in both directions.

The magneto-resistive structures 110-1, 110-2 may be coupled by the electrical contact structure 200 in parallel forming a first group such as the third and fourth magneto-resistive structures 110-3, 110-4, being coupled parallel to form a second group. Both groups may be coupled in series to one another as described before.

Figure 19:
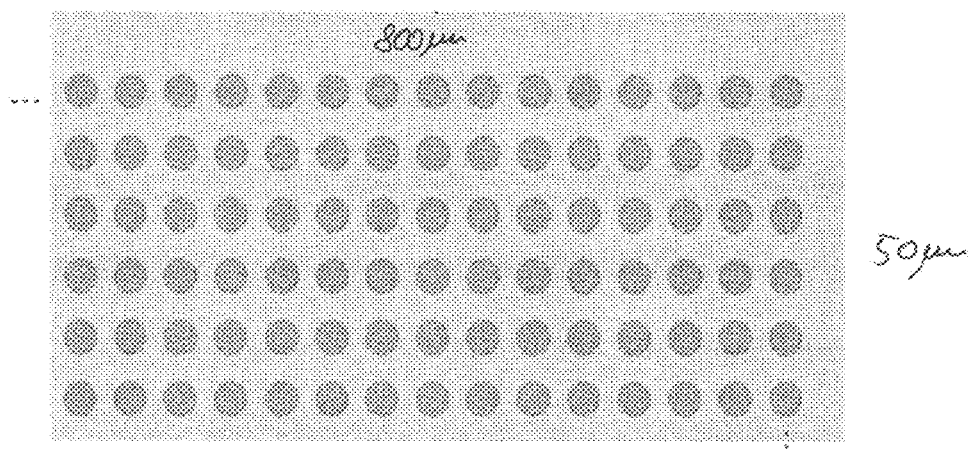
FIG. 19 shows a simplified plan view of a total area of a device comprising several magneto-resistive structures.

Based on this building block shown in FIG. 18, it may be possible to obtain, for instance, for a GMR-based system, a magneto-resistive structure 110 having a resistance value of approximately 3.5Ω with an overlap of 30%. Given the four elements, in an arrangement of approximately 800 μm×50 μm approximately 1111 may be arranged as depicted in FIG. 19.

Figure 20:
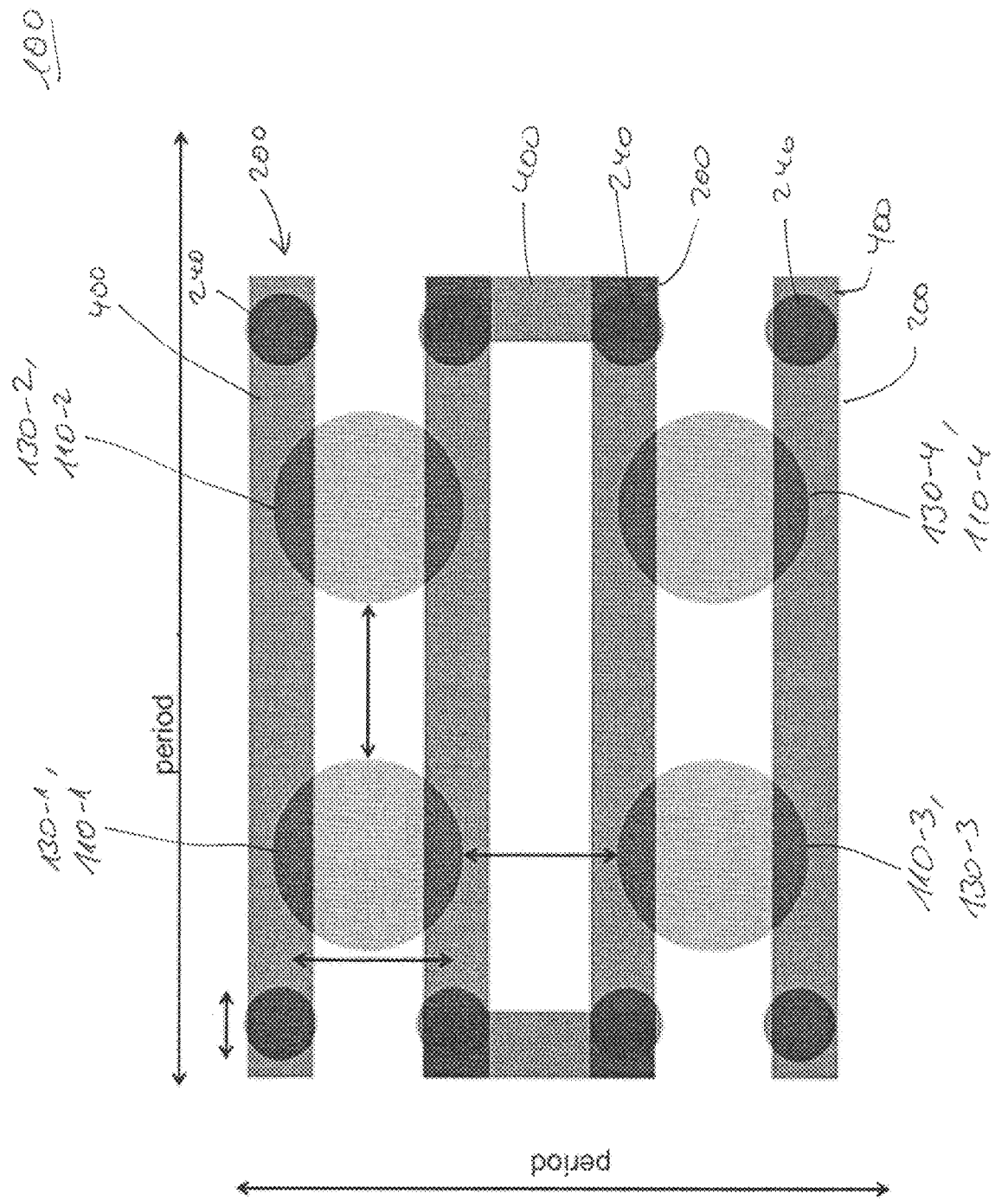
FIG. 20 shows a simplified plan view of a further device.

FIG. 20 shows a simplified plan view of a further device 100 or, to be more precise, of a building block having a periodicity of 7.5 μm×6 μm in the example shown here. This building block also comprises four magneto-resistive structures 110 having the same distances and diameters as the ones described before. Once again, the first two magneto-resistive structures 110-1, 110-2 are coupled in parallel as are the third and fourth magneto-resistive structures 110-3, 110-4 forming two groups of magneto-resistive structures 110, which in turn, are coupled in series.

However, while the electrical contact structures 200 in the previously described examples are implemented such that vias 240 directly contact the magnetic free layers 130, in the implementation shown here, the vias 240 are used to electrically contact conductive structures such as metallic lines and more complex structures, which contact the magnetic free layers 130 on top. In other words, the vias 240 may be used to electrically contact the conductive structures 400 deposited on top of the magneto-resistive structures 110. As a consequence, lateral dimension along one direction may be a little larger compared to the previously described implementation.

It should be noted that although in the previously described embodiments, always the magnetic free layer 130 has been contacted by the electrical contact structure 200, in other examples of a device 100 also the magnetic reference layer 140 may be electrically coupled to the electrical contact structure 200. Naturally, in other embodiments, both the magnetic free layer 130 and the magnetic referenced layer 140 of an individual magneto-resistive structure 110 may be coupled.

In conventional magneto-resistive angle sensors, the sensor elements work in the saturation mode. As a consequence, a field strength of an external rotating magnetic field is typically high enough for the sensor free layer to overcome material inherent and geometry oriented magnetic anisotropies to achieve a low angular accuracy. In case there is a static disturbance magnetic field present, the magnetization may align the vector sum of the external field and the disturbance field. As a consequence, a wrong angle of the external magnetic field may be measured. Since the sensor usually works in saturation mode, there is typically no information given about the in-plane components or the effective external field strengths. Typical disturbance fields are approximately 1.5 mT at a rotating field strength between 20 mT and 70 mT.

Figure 21:
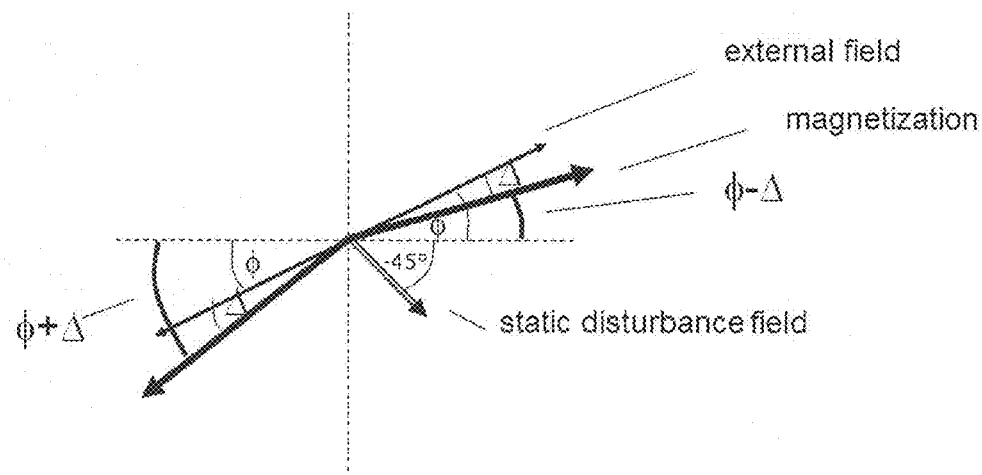
FIG. 21 illustrates schematically an influence of a static disturbance field on an angle deviation of a magneto-resistive free layer magnetization from a reference angle.

FIG. 21 schematically illustrates an effect of a static disturbance field on the effective field vector. Depending on the orientation of the external rotating field, the disturbance field increases or reduces an angle of the external field.

Figure 22:
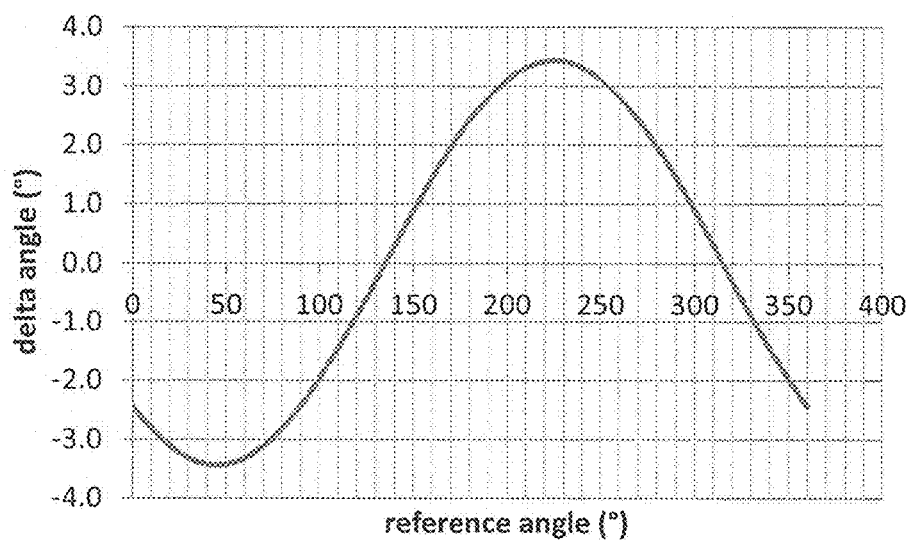
FIG. 22 illustrates the deviation of the free layer magnetization for a specific example.

To illustrate this further, FIG. 22 illustrates a deviation of a free layer magnetization as a function of a reference angle for an external disturbance field of approximately 1.5 mT and a rotating magnetic field of 25 mT, where the disturbance field comprising an angle of −45° with respect to a reference direction. To be more precise, FIG. 22 displays an angle deviation of the effective field and the external rotating field over a full 360° angle range. The disturbance field of 1.5 mT in combination with a rotating magnetic field strength of 25 mT causes a maximum deviation of a free layer magnetization of approximately 3.4°.

As will be laid out in more detail below, the presence of a static disturbance field may be detected and a calculation of its direction and field strength may be used in order to compensate the angle deviation at least partially.

Conventionally, based on magneto-resistive sensors alone, a solution to this problem is unknown. By integrating a two-dimensional or three-dimensional magnetic field sensor, for instance, by implementing a Hall sensor, it may be possible to directly measure the strength of a magnetic field component. However, implementing this technology may lead to significantly higher implementation effort and, therefore, to higher costs due to the additional technology to be implemented in addition to the magneto-resistive technology. Based on a magneto-resistive structure, for instance a magneto-resistive spin-valve type stack with a free layer 130 exhibiting a single magnetic vortex or a similar vortex-like structure or any closed-flux magnetization pattern within a specified magnetic field range, it may be possible to compensate at least partially an influence of a static disturbance field. At the same time, the magnetization of the reference layer 130 or system may be homogeneously magnetized along a certain direction or axis.

Depending on the lateral size, a free layer thickness, free layer material properties and other parameters, the magnetization of the free layer 130 will form a single vortex spontaneously at a zero field. In other words, a circumferential in-plane closed flux magnetization pattern may be formed, which leads to a minimization of its total free magnetic energy. The core of the in-plane closed flux magnetization pattern, such as a vortex, may comprise a region with a magnetization perpendicular to the plane. Upon an external magnetic in-plane field, the region of magnetizations parallel to the external magnetic field increases by moving the core as outlined before. The left part of FIG. 10 shows the corresponding bird's view on the magnetization of a free layer at a vanishing external magnetic field (H=0 mT) with a core being in the center of the circular structure. When a magnetic field in the x-direction is applied, the core is moving up in the given example, according to the magnetic field strength as depicted in the right part of FIG. 10. As a result, the net magnetization of a vortex along the x-direction is changed, which can be detected by a magneto-resistive effect such as GMR- or TMR-effect between the free layer and the corresponding reference layer with a homogeneous magnetization or a similar non-closed flux magnetization pattern with a corresponding homogeneous magnetization or net magnetization with respect to a certain direction.

Upon a magnetic field with a Hy-component, the core of the vortex moves along the x-direction or axis. Upon a rotating magnetic field, the core of the vortex also performs a rotating movement. Since there is no re-magnetization of the magnetization regions against the shape anisotropy, there are typically only intrinsic material originated anisotropies influencing the free layer magnetization. Therefore, especially at low-rotating magnetic fields, a small angular error may be expected for a sensor having a single vortex magnetized free layer or a similar in-plane closed flux magnetization pattern.

As outlined before, typical configurations to achieve such spontaneous vortex magnetizations may be a disc-shaped magnetic free layer 130 having a diameter of somewhere in between 100 nm and 5000 nm and a free layer thickness in between 1 nm and 50 nm.

FIG. 12 has already shown a magnetization Mx of a vortex-like magnetized ferromagnetic layer as a function of an external in-plane magnetic field Hx. As discussed earlier, there is a wide linear change of the magnetization Mx. Exceeding the so-called annihilation field Han, the vortex magnetization is destroyed in favor of a c- or s-state magnetization with a net magnetization along the external field direction.

When the magnetic field is reduced, the vortex magnetization is spontaneously formed when the nucleation field Hn is underrun, where, for the sake of simplicity only here and in other parts of the description, the magnetic polarization $\mu_0$ has been left out. If no other magnetic forces are effective, this behavior may be symmetric for positive and negative magnetic fields. If the external field keeps below the annihilation field, the transfer characteristic is basically free of hysteresis. Furthermore, depending on the geometry such as size and film thickness of the free layer, the linear range can be as high as 100 mT or even higher.

A device 100 according to an example may be used to implement in addition to a more conventional high precision magneto-resistive angle sensor, an angle sensor exhibiting a free layer with a single vortex or a similar magnetization pattern. In case the external rotating field strength is below the annihilation field, the vortex sensor may give an output signal with a magnitude proportional to the external effective magnetic field. A resulting modulation of a vector length of a measured signal of a sinus and cosine-Wheatstone bridge in the case of a fully implemented system may be used to conclude on the direction and the signal height ratio of a static disturbance magnetic field.

For instance, to implement such an on-axis magneto-resistive angle sensor with a disturbance field suppression by a free layer having a single magnetic vortex or similar magnetization pattern, the following procedure for an at least partial disturbance field suppression may be implemented, for instance, in the circuit 160 as described before. In a first operation, the output signals of a sinus- and cosine-Wheatstone bridge of a main, conventional magneto-resistive angle sensor Vsin and Vcos may be measured. On the basis of these voltages a raw angle $\varphi_{raw}$ may be calculated, using, for instance, a tangential relationship or a similar technique implementing, for instance, a look-up table.

In a second operation, the output signal of a sinus- and cosine-Wheatstone bridge of a sensor with a vortex or similar magnetized free layer Vsinvortex and Vcosvortex may be measured and compensated for the offset in case of a temperature with a corresponding offset temperature Tc.

In a next process, a so-called vector length VL of both signals may be calculated based on equation (3).

$$VL = \sqrt{V_{SINVortex}^2 + V_{COSVortex}^2} \quad (3)$$

In case of no additional disturbance fields, VL is a constant and, for instance, equal to one if normalized values Vsin and Vcos signals are used for any of the regular or standard magneto-resistive sensor bridge and the magneto-resistive sensor bridge using an in-plane closed flux magnetization pattern (such as a vortex or vortex-like pattern). In case of a static disturbance field, the vector length VL may follow an oscillating behavior over an angle of the rotating field as depicted, for example, given in FIG. 23 based on the example conditions used for FIG. 22, for instance, in the case of sensor signals of a sensor using an in-plane closed flux magnetization pattern.

Figure 23:
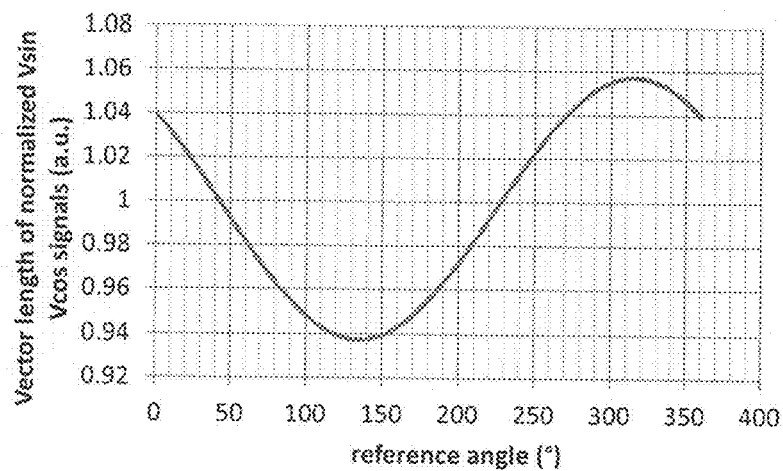
FIG. 23 illustrates a function of a vector length as a function of a reference angle.

In other words, FIG. 23 shows a dependence of the vector length VL as a function of an external rotating field angle in case of a static disturbance field with a disturbance field strength of approximately 1.5 mT, a rotational field strength of 25 mT and an angle of −45° with respect to a reference direction. FIG. 23 shows normalized signals. An amplitude of the modulation is approximately +/−6%, which is approximately equivalent to a ratio of the disturbance magnetic field strength to the rotational magnetic field strength.

In a next process, an amplitude and a phase of a sinusoidal modulation of the vector length may be calculated.

In case the application delivers data from at least 270° angle range, there are two extreme values available from a sinusoidal modulation of the vector length, allowing the vector length to be directly calculated from an amplitude of the signal according to equation (4) for a sensor using an in-plane closed flux magnetization pattern.

$$A_{VL} = \frac{VL_{max} - VL_{min}}{2} \quad (4)$$

The relative signal swing of the vector length modulation as a function of the angle is approximately equivalent to a ratio of the static disturbance field and the rotating magnetic field strength. An amplitude of the signal swing is, however, independent of the absolute signal height of the bridge signals and therefore, temperature independent. Moreover the angle position of the vector length maximum may be approximately equivalent to the direction of the static disturbance field $\Phi_{VL}$.

In case sensor data from less than 270° angle range are available, the same or a similar calculation may be performed based on a FFT, a sinusoidal fit of the data or a similar technique extracting the amplitude $A_{VL}$ and the phase correlation $\Phi_{VL}$.

In a next process, a correction value for the calculated angle from the raw data may be calculated according to equation (5).

$$\varphi_{corr} = ATAN(A_{VL}) \cdot \sin(90° + \Phi_{VL} + \varphi_{raw}) \quad (5)$$

In a next process, the new, compensated angle value $\varphi_{comp}$ may be calculated according to equation (6).

$$\varphi_{comp} = \varphi_{raw} + \varphi_{corr} \quad (6)$$

Optionally, a repetition of the previously-described operations with a new value of $\varphi_{comp}$ value for the first $\varphi_{raw}$ may be applied to further improve the compensation quality.

Figure 24:
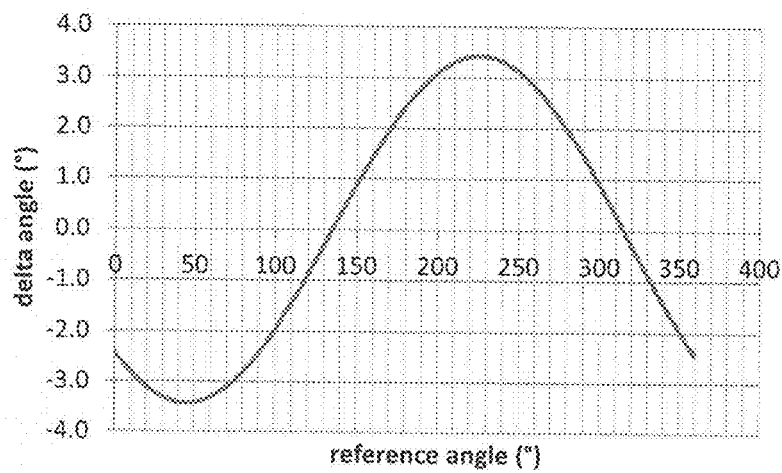
FIG. 24 shows an angle error for a disturbance field of approximately 1.5 mT at an angle of −45° and a rotation magnetic field of 25 mT before the compensation.

FIG. 24 shows an angle error for a disturbance magnetic field of approximately 1.5 mT and a rotation magnetic field strength of approximately 25 mT at an angle of approximately −45° before the compensation. Similarly, FIG. 25 shows the angle error after a compensation procedure has been performed as outlined above.

Figure 25:
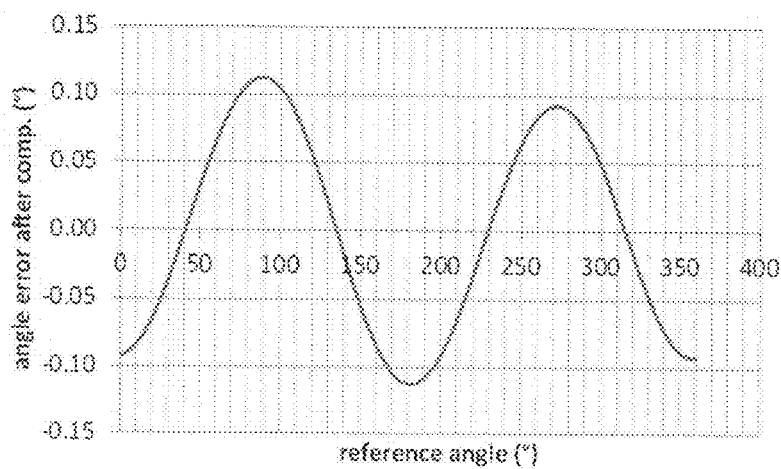
FIG. 25 shows an angle error for a disturbance field of approximately 1.5 mT at an angle of −45° and a rotation magnetic field of 25 mT after a compensation procedure.

FIG. 25 shows the residual angle error after a compensation procedure has been performed for the above-described examples of a disturbance magnetic field of approximately 1.5 mT at an angle of approximately −45° and a rotation magnetic field strength of approximately 25 mT. The angle error is reduced from approximately 3.4% as shown, for instance, in FIG. 24 down to approximately 0.1°. However, a quality of a compensation may be influenced by the quality of a linear response of the field strength. A deviation from linear behavior may result in falsified calculations of a ratio of the disturbance magnetic field with respect to the rotation magnetic field and, therefore, may lead to a less good corrected angle value.

Figure 26:
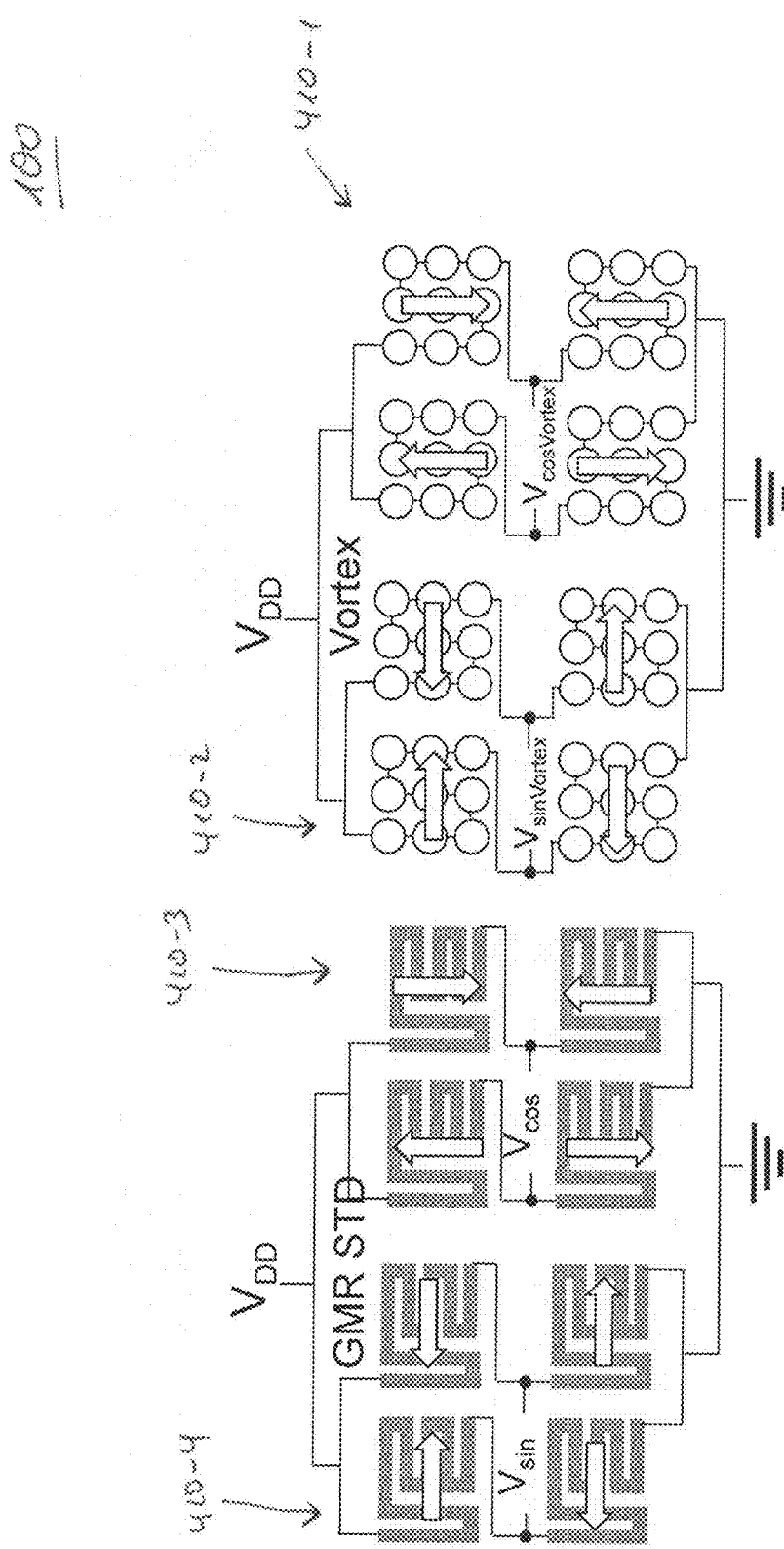
FIG. 26 shows a schematic view of a full angle sensor device.

FIG. 26 shows a schematic block diagram of a device 100 comprising four different Wheatstone bridges 410-1, 410-2, 410-3 and 410-4. Each of the Wheatstone bridges 410 is coupled in between a terminal for a supply voltage VDD and a terminal for a ground potential. The Wheatstone bridges 410-1 and 410-3 are designed to be responsive to an external magnetic field having a magnetic field component along a first direction while the Wheatstone bridges 410-2 and 410-4 are designed to be sensitive to an external magnetic field having a magnetic field component along a second direction perpendicular to the first direction. For instance, the first direction may be a y-direction, while the second direction being perpendicular to the first direction may be an x-direction.

The Wheatstone bridges 410-1, 410-2 are based on magneto-resistive structures 110 comprising a magnetic free layer 130 (not shown in FIG. 26) with an in-plane closed flux magnetization pattern, while a corresponding magnetic reference layer 140 comprises a non-closed flux magnetization pattern. In contrast, the magneto-resistive structures of the third and fourth Wheatstone bridge 410-3, 410-4 are further magneto-resistive structures 170 comprising a further magnetic free layer 180 (not shown in FIG. 26) and a further magnetic reference layer 190 both having a non-closed flux magnetization pattern. In other words, the magneto-resistive structures 110 of the first two Wheatstone bridges 410-1, 410-2 may be based on vortex-based magneto-resistive structures 110, while the further magneto-resistive structures 170 of the third and fourth Wheatstone bridges 410-3, 410-4 may be more conventional magneto-resistive structures.

Naturally, instead of implementing full Wheatstone bridges each comprising four groups of magneto-resistive structures 110 or further magneto-resistive structures 170, two of which comprise net magnetizations in terms of the magnetic reference layers 140 or the further magnetic reference layers 190 being arranged antiparallel, also half bridges may be used, for instance, along with voltage dividers or other half bridges.

In other words, FIG. 26 shows an example of a device 100 comprising, for instance, standard magneto-resistive angle sensors in combination with vortex or vortex-like magneto-resistive angle sensors working in their linear ranges. Instead of an additional sensor with a single vortex magnetized free layer, also additional vertical Hall sensor delivering a signal output upon a rotating magnetic in-plane field may be implemented. In FIG. 26 in the left part, a schematic circuit of a standard magneto-resistive angle sensor having two Wheatstone full bridges 410-3, 410-4 providing a V sin- and a V cos-output signal in response to a rotating magnetic field are coupled along with magneto-resistive angle sensors having a single vortex magnetized free layer comprising also two Wheatstone full bridges 410-1, 410-2 delivering a V sinvortex- and a V cosvortex-output signal upon the same rotating magnetic field as depicted in the right part of FIG. 26. In other words, FIG. 26 shows a combination of a schematic circuit of a standard magneto-resistive angle sensor comprising two Wheatstone full bridges 410-3, 410-4 delivering a sinus- and a cosine-like output signal. The big arrows in FIG. 26 indicate the reference layer magnetization direction of the reference system. Within each of the full bridges 410, the directions are anti-parallel aligned. Between both bridges, the reference directions are orthogonal to each other. In contrast, on the right part of the circuit shown in FIG. 26, schematically the circuit of an angle sensor having a single vortex magnetized free layer is shown. It also comprises two Wheatstone full bridges 410-1, 410-2 delivering a V sinvortex and a V cosvortex output signal, respectively, upon a rotating magnetic field. However, it might be advisable to design the device 100 in such a way that the magnetic field does not exceed the annihilation field Han of the vortex magnetization of the magneto-resistive sensors 110 of the first two Wheatstone bridges 410-1, 410-2.

The described process may, eventually, also be used in context with an only Hall solution or another single sensor-type or multiple sensor-type implementation.

A device 100, for instance, as the one shown in FIG. 26, is based on the combination of standard magneto-resistive angle sensors and an additional angle sensor structure, which exhibits spontaneously formed single vortex magnetization of the free layer or a similar in-plane closed flux magnetization pattern. In the example shown in FIG. 26, the magneto-resistive structures are all based on GMR-based technology. Naturally, also other magneto-resistive technologies, as well as a combination may be used.

Within the relevant magnetic field range, the sensor signals may be assumed to be proportional to the external field strength. A static disturbance magnetic field in combination with a rotating magnetic field of constant field strength may result in the modulation of the vector length of a sinus- and cosine-bridge signal. The signal swing and phase of the modulation may allow to conclude the direction and/or the strength of the static disturbance magnetic field. As outlined before, a procedure is described and may be implemented to calculate an improved or closer to reality angle without a static disturbance magnetic field.

Such an implementation may, for instance, comprise a magneto-resistive angle sensor in combination with an additional sensor structure comprising a single vortex magnetized free layer, spontaneously formed single vortex magnetized free layers with a nucleation magnetic field of more than 0 mT, and a unidirectional homogeneous magnetized reference system along an axis or another non-closed flux magnetization pattern. On other words, the unidirectional homogeneous magnetized reference system does not have a vortex magnetization. Such a magneto-resistive angle sensor may be operated in a CIP or CPP configuration, comprising, for instance, an annihilation magnetic field between 70 mT and 100 mT. The magneto-resistive angle sensor may comprise a free layer thickness between 1 nm and 50 nm. It may further comprise a free layer structure size between 100 nm and 5 µm. It may comprise a non-elongated free layer shape such as a circle, triangle, square or another polygonal form.

The angle sensor may be operated in combination with an additional sensor structure comprising a signal output amplitude proportional to the external field strength. The described algorithm procedure may evaluate the modulation of a vector length originating from a static disturbance magnetic field to suppress the disturbance field effect on the angle calculation. Naturally, the device 100 may comprise one or more substrates 120 or may be implemented on one or more corresponding dies.

A device according to an embodiment may improve a trade-off between fabricating, accuracy of determining a magnetic quantity or magnetic quantities and an implementation of a corresponding device.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A device comprising:
    a first magneto-resistive structure comprising:
        a magnetic free layer with a spontaneously generated in-plane closed flux magnetization pattern that exists in an absence of an external magnetic field applied to the magnetic free layer, the closed flux magnetization pattern having a core that is configured to shift within the closed flux magnetization pattern in a first direction based on an external magnetic field applied to the free layer in a second direction perpendicular to the first direction, and
        a magnetic reference layer having a non-closed flux magnetization pattern; and
    an electrical contact structure including electrically-conductive components, the electrical contact structure electrically contacting the first magneto-resistive structure via the electrically-conductive components being directly connected to the magnetic reference layer, the electrical contact structure overlapping with the magnetic free layer such that the electrical contact structure overlaps at most 30% of a minimum bounding circle for the magnetic free layer that fully encompasses the magnetic free layer, the overlap being viewed in a direction perpendicular to the in-plane closed flux magnetization pattern.

2. The device according to claim 1, wherein the closed flux magnetization pattern is one of a Landau pattern or a vortex pattern.

3. The device according to claim 1, wherein the non-closed flux magnetic pattern comprises a uniaxial magnetization pattern.

4. The device according to claim 3, wherein the electrical contact structure is arranged to touch or to be arranged outside any of the magnetic free layer or a projection of the magnetic free layer.

5. The device according to claim 3, wherein the electrical contact structure is configured such that a current flowing through the first magneto-resistive structure is parallel or antiparallel to a direction of a net magnetization of the magnetic reference layer.

6. The device according to claim 1, wherein the first magneto-resistive structure is an anisotropic magneto-resistive structure, a giant magneto-resistive structure, a tunnel magneto-resistive structure, or an extraordinary magneto-resistive structure.

7. The device according to claim 1, wherein the magnetic free layer is configured to spontaneously form the in-plane closed flux magnetization pattern in response to the external magnetic field applied to the magnetic free layer having a magnetic field strength smaller than a nucleation magnetic field strength.

8. The device according to claim 7, wherein the nucleation magnetic field strength is equal to or larger than 100 µT.

9. The device according to claim 1, wherein a non-closed flux magnetization pattern exists in the magnetic free layer when the external magnetic field applied in the second direction has an external magnetic field strength larger than an annihilation magnetic field strength associated with the magnetic free layer equal to or larger than 5 mT and being equal to or smaller than 100 mT.

10. The device according to claim 1, wherein the magnetic free layer includes a circumferential shape in a plane of the magnetic free layer.

11. The device according to claim 1, wherein the magnetic free layer is one of a circular shape, an elliptic shape, or a polygonal shape.

12. The device according to claim 1, wherein the magnetic free layer comprises a maximum structure size in a plane of the magnetic free layer in a range between 100 nm and 5 µm.

13. The device according to claim 1, wherein the magnetic free layer comprises a thickness in a range between 1 nm and 50 nm.

14. The device according to claim 1, comprising a second magneto-resistive structure electrically coupled in series to the first magneto-resistive structure.

15. The device according to claim 1, wherein the magnetic reference layer comprises a synthetic anti-ferromagnetic structure to pin the non-closed flux magnetization pattern of the magnetic reference layer.

16. The device of claim 1, further comprising a circuit to detect a change of an electrical parameter of the first magneto-resistive structure in response to the external magnetic field applied in the second direction.

17. The device according to claim 1, wherein the first and second directions extend along a plane comprising the in-plane closed flux magnetization pattern.

18. The device according to claim 1, wherein the device omits employment shape anisotropy for the magnetic free layer.

19. The device according to claim 1, wherein the magnetic free layer is circumscribed by the minimum bounding circle.

20. The device according to claim 1, wherein the minimum bounding circle is dimensioned such that a number of points of the magnetic free layer that are contacted by the minimum bounding circle are maximized.

21. The device according to claim 1, wherein the magnetic free layer is circular shaped.

22. The device according to claim 1, wherein the electrical contact structure includes conductive layers coupled to the electrically-conductive components.

23. The device according to claim 22, wherein the electrical contact structure overlaps with the magnetic free layer with respect to a plane that is parallel to the magnetic free layer and along a direction that is parallel or antiparallel to a direction of a net magnetization of the magnetic reference layer.

24. A magnetic sensor device comprising:
a magneto-resistive structure comprising a magnetic free layer including a spontaneously formed in-plane closed flux magnetization pattern that exists in an absence of external magnetic field applied to the magnetic free layer, the closed flux magnetization pattern having a core that is configured to shift within the closed flux magnetization pattern in a first direction based on an external magnetic field applied to the free layer in a second direction perpendicular to the first direction, and provide a magnetic reference layer comprising a reference magnetization pattern;
an electrical contact structure including electrically-conductive components, the electrical contact structure electrically contacting the magneto-resistive structure via the electrically-conductive components being directly connected to the magnetic reference layer, the electrical contact structure overlapping with the magnetic free layer such that the electrical contact structure overlaps at most 30% of a minimum bounding circle for the magnetic free layer that fully encompasses the magnetic free layer,
wherein the overlap is viewed in a direction perpendicular to the in-plane closed flux magnetization pattern;
a further magneto-resistive structure comprising a further magnetic free layer with an in-plane non-closed flux magnetization pattern and a further magnetic reference layer comprising a further reference magnetization pattern; and
at least one circuit to detect a change of an electrical parameter of the magneto-resistive structure and to detect a change of an electrical parameter of the further magneto-resistive structure in response to the external magnetic field applied in the second direction.

25. The magnetic sensor device according to claim 24, wherein the circuit is further configured to provide a sensing signal indicative of at least one of a direction of the external magnetic field in the second direction and a strength of the external magnetic field in the second direction acting on the free magnetic layer and the further free magnetic layer based on a response of the magneto-resistive structure and response of the further magneto-resistive structure.

26. A device comprising:
a magneto-resistive structure comprising a magnetic free layer with a spontaneously formed in-plane closed flux magnetization pattern that exists in an absence of an applied external magnetic field applied to the magnetic free layer, the closed flux magnetization pattern having a core that is configured to shift within the closed flux magnetization pattern in a first direction based on an external magnetic field applied to the free layer in a second direction perpendicular to the first direction, and a magnetic reference layer having a non-closed flux magnetization pattern; and
an electrical contact structure that is configured to feed an electrical current into the magneto-resistive structure in a current-in-plane configuration,
wherein the electrical contact structure includes electrically-conductive components, the electrical contact structure electrically contacting the magneto-resistive structure via the electrically-conductive components being directly connected to the magnetic reference layer, and
wherein the electrical contact structure overlaps with the magnetic free layer such that the electrical contact structure overlaps at most 30% of a minimum bounding circle for the magnetic free layer that fully encompasses the magnetic free layer,
wherein the overlap is viewed in a direction perpendicular to the in-plane closed flux magnetization pattern.

27. A method comprising:
detecting a change of a spontaneously formed in-plane closed flux magnetization pattern in a magnetic free layer in reference to a magnetic reference layer having a non-closed flux magnetization pattern, the closed flux magnetization pattern existing in an absence of an external magnetic field applied to the magnetic free layer, wherein the closed flux magnetization pattern has a core that is configured to shift within the closed flux magnetization pattern in a first direction based on an external magnetic field applied to the free layer in a second direction perpendicular to the first direction; and
providing, a current, by an electrical contact structure that electrically contacts the magnetic free layer, to flow through the magnetic free layer that is parallel or antiparallel to a direction of a net magnetization of the magnetic reference layer,
wherein the electrical contact structure includes electrically-conductive components, the electrical contact structure electrically contacting the magneto-resistive structure via the electrically-conductive components being directly connected to the magnetic reference layer, and
wherein the electrical contact structure overlaps with the magnetic free layer such that the electrical contact structure overlaps at most 30% of a minimum bounding circle for the magnetic free layer that fully encompasses the magnetic free layer, and
wherein the overlap is viewed in a direction perpendicular to the in-plane closed flux magnetization pattern.

28. The method of claim 27, wherein detecting the change comprises detecting an electric response of the magneto-resistive structure comprising the magnetic free layer and the magnetic reference layer.

* * * * *